United States Patent
Spindler et al.

(10) Patent No.: US 7,645,524 B2
(45) Date of Patent: Jan. 12, 2010

(54) OLED DEVICE WITH IMPROVED HIGH TEMPERATURE OPERATION

(75) Inventors: Jeffrey P. Spindler, Rochester, NY (US); Tukaram K. Hatwar, Penfield, NY (US)

(73) Assignee: Eastman Kodak Company, Rochester, NY (US)

( * ) Notice: Subject to any disclaimer, the term of this patent is extended or adjusted under 35 U.S.C. 154(b) by 700 days.

(21) Appl. No.: 11/253,923

(22) Filed: Oct. 19, 2005

(65) Prior Publication Data

US 2007/0085474 A1  Apr. 19, 2007

(51) Int. Cl.
  *H01L 51/54*  (2006.01)
(52) U.S. Cl. ........................ 428/690; 428/917; 428/212; 313/504; 313/506
(58) Field of Classification Search .................. 427/66; 313/504, 506
  See application file for complete search history.

(56) References Cited

U.S. PATENT DOCUMENTS

| | | | |
|---|---|---|---|
| 4,769,292 A | | 9/1988 | Tang et al. |
| 5,554,450 A | * | 9/1996 | Shi et al. ................. 428/690 |
| 6,013,384 A | | 1/2000 | Kido et al. |
| 6,509,109 B1 | | 1/2003 | Nakamura et al. |
| 6,566,807 B1 | | 5/2003 | Fujita et al. |
| 6,589,673 B1 | | 7/2003 | Kido et al. |
| 2003/0068524 A1 | * | 4/2003 | Hatwar ...................... 428/690 |
| 2003/0099860 A1 | * | 5/2003 | Lin et al. .................. 428/690 |
| 2003/0118866 A1 | * | 6/2003 | Oh et al. ................... 428/690 |
| 2004/0046495 A1 | * | 3/2004 | Peng ......................... 313/504 |
| 2004/0076853 A1 | * | 4/2004 | Jarikov ..................... 428/690 |
| 2004/0124766 A1 | * | 7/2004 | Nakagawa et al. ......... 313/504 |

FOREIGN PATENT DOCUMENTS

WO  WO 2004/093207  * 10/2004

OTHER PUBLICATIONS

Shen et al., Journal of Materials Chemistry, 2005, p. 2455-2463.*
Organic Electtroluminescent Diodes; C.W. Tang and S.A. VanSlyke, Appl.Phys. Lett. 51 (12), Sep. 21, 1987; 913-915.
Electroluminescence of Doped Organic Thin Films; C.W. Tang, S.A. VanSlyke, and C. H. Chen; J. Appl.Phys. 65 (9); May 1999.
Electroluminescence in Organic Filoms with Three-Layer Structure; Chihaya Adachi et al.; Japanese Journal of Appl. Phys.; vol. 27, No. 2; Feb. 1988; pp. L269-L271.

* cited by examiner

*Primary Examiner*—Dawn Garrett
(74) *Attorney, Agent, or Firm*—Raymond L. Owens

(57) ABSTRACT

A method of making an OLED device includes providing an anode and a spaced cathode, and a hole-transporting layer provided between the anode and cathode, such hole-transporting layer including a first hole-transporting material having a first glass transition temperature $T_{g1}$. The method further includes providing a first light-emitting layer including as a main component, a second hole-transporting material having a second glass transition temperature $T_{g2}$, such light-emitting layer disposed between the hole transporting layer and the cathode and in contact with the hole-transporting layer, and wherein $T_{g1}$ is greater than $T_{g2}$.

9 Claims, 3 Drawing Sheets

OLED DEVICE WITH IMPROVED HIGH TEMPERATURE OPERATION

FIELD OF THE INVENTION

The present invention relates to providing an organic electroluminescent device having improved high temperature performance.

BACKGROUND OF THE INVENTION

Organic electroluminescent (EL) devices, or organic light-emitting diodes (OLEDs), are electronic devices that emit light in response to an applied potential. The structure of an OLED includes, in sequence, an anode, an organic EL unit, and a cathode. The organic EL unit disposed between the anode and the cathode is commonly comprised of an organic hole-transporting layer (HTL) and an organic electron-transporting layer (ETL). Holes and electrons recombine and emit light in the ETL near the interface of HTL/ETL. Tang et al., "Organic Electroluminescent Diodes", *Applied Physics Letters*, 51, 913 (1987), and commonly assigned U.S. Pat. No. 4,769,292 demonstrated highly efficient OLEDs using such a layer structure. Since then, numerous OLEDs with alternative layer structures have been disclosed. For example, there are three layer OLEDs that contain an organic light-emitting layer (LEL) between the HTL and the ETL, such as that disclosed by Adachi et al., "Electroluminescence in Organic Films with Three-Layer Structure", *Japanese Journal of Applied Physics*, 27, L269 (1988), and by Tang et al., "Electroluminescence of Doped Organic Thin Films", *Journal of Applied Physics*, 65, 3610 (1989). The LEL commonly includes a host material doped with a guest material wherein the layer structures are denoted as HTL/LEL/ETL. Further, there are other multilayer OLEDs that contain more functional layers in the devices. At the same time, many kinds of EL materials are also synthesized and used in OLEDs. These new structures and new materials have further resulted in improved device performance.

EL devices in recent years have expanded to include not only single color emitting devices, such as red, green and blue, but also devices that emit white light. Efficient white light producing OLED devices are highly desirable in the industry and are considered as a low cost alternative for several applications such as full color displays, paper-thin light sources, backlights in LCD displays, automotive dome lights, and office lighting. White light producing OLED devices should be bright, efficient, and generally have Commission International d'Eclairage (CIE) chromaticity coordinates of about (0.33, 0.33). In any event, in accordance with this disclosure, white light is that light which is perceived by a user as having a white color.

An OLED is actually a current driven device. Its luminance is proportional to current density, but its lifetime is inversely proportional to current density. In order to achieve high brightness, an OLED has to be operated at a relatively high current density, but this will result in a short lifetime. Thus, it is critical to improve the luminous efficiency of an OLED while operating at the lowest possible current density consistent with the intended luminance requirement to increase the operational lifetime.

In addition to the continued need to provide OLEDs having improved lifetime, it is desirable to have OLED devices with good operational performance in luminance and voltage stability over the lifetime of the OLED device under varying operating conditions. For practical applications, OLED devices should have high luminance stability and voltage stability under ambient conditions as well as higher operating temperature conditions (such as greater than 85° C.).

In many electronic systems, e.g., in some active matrix display designs, the available voltage is limited and the power consumption is directly proportional to the voltage required to drive the OLED and the TFTs. Thus, there is a need to reduce the voltage necessary to drive the OLED. One way to lower the OLED driving voltage is to provide an electron-injecting layer (EIL), which typically includes an electron-transporting material doped with an n-type dopant such as a low-work function metal. For example, see U.S. Pat. Nos. 6,013,384, 6,509,109, 6,566,807, and 6,589,673. However, the high temperature operational stability is a major issue. The lower softening temperature (Tg) of the organic materials limits the use of this device in high temperature conditions. Also if the device is designed for high temperature operation, it does not necessarily function well under ambient conditions.

SUMMARY OF THE INVENTION

It is an object of the present invention to provide an OLED device with good operational performance under ambient and high temperature conditions.

These objects are achieved by providing a method of making an OLED device comprising:

a) providing an anode and a spaced cathode, and a hole-transporting layer provided between the anode and cathode, such hole-transporting layer including a first hole-transport-ing material having a first glass transition temperature Tg1; and b) providing a first light-emitting layer including as a main component, a second hole-transporting material having a second glass transition temperature Tg2, such light-emitting layer disposed between the hole transporting layer and the cathode and in contact with the hole-transporting layer, and wherein Tg1 is greater than Tg2.

An OLED device prepared in accordance with the present invention can have high efficiency, low initial drive voltage, low voltage rise during operation (high voltage stability), and long lifetime (high luminance stability) during operation under both ambient and high temperature conditions. White light-emitting OLED devices can effectively use the present invention.

Figure 1:
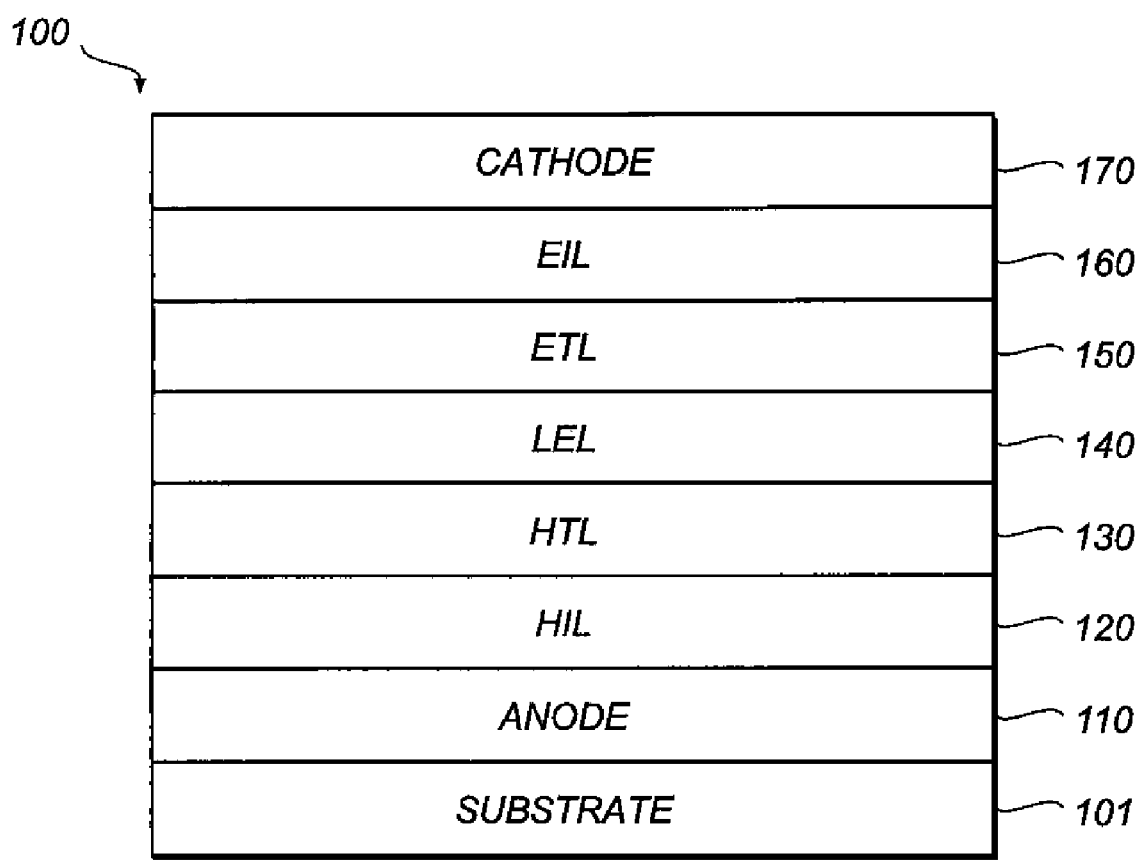
FIG. 1 depicts a schematic cross sectional view of a typical OLED structure.
Figure 2:
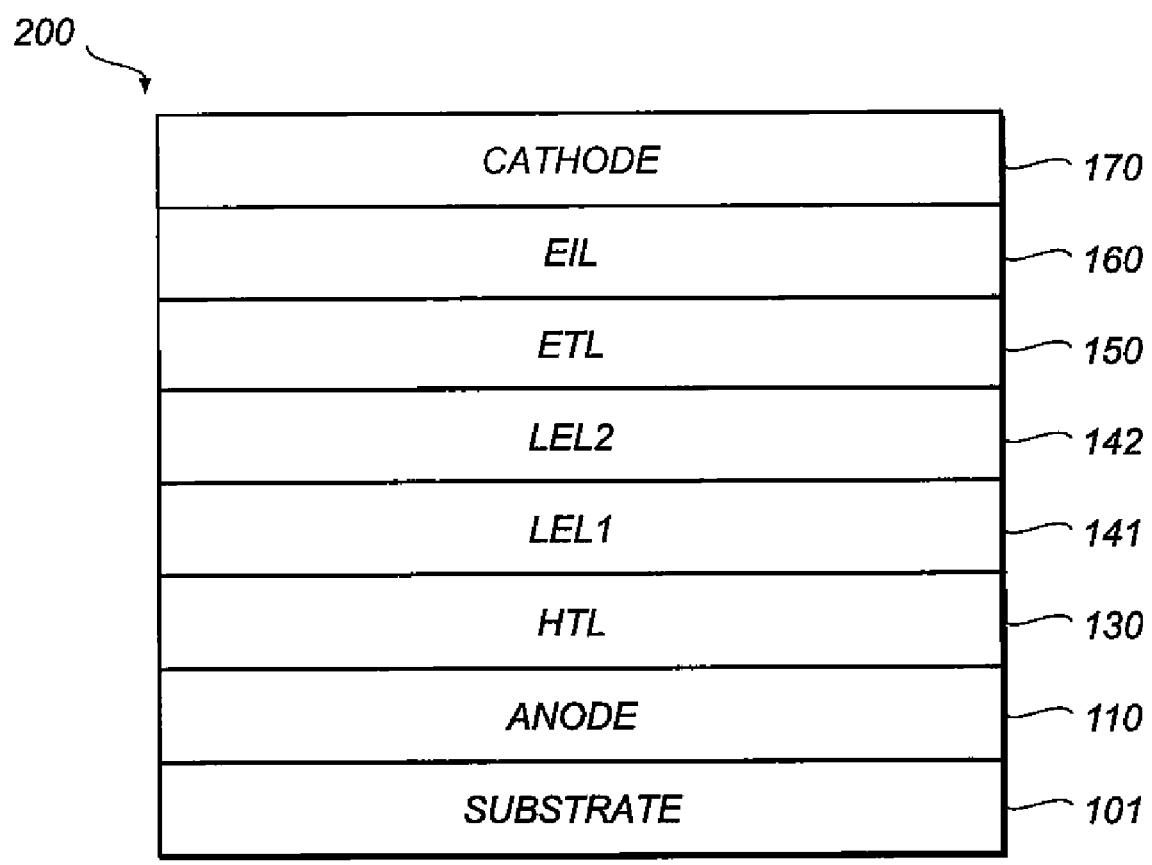
FIGS. 2-3 depict schematic cross sectional views of OLED structures according to the present invention.
Figure 3:
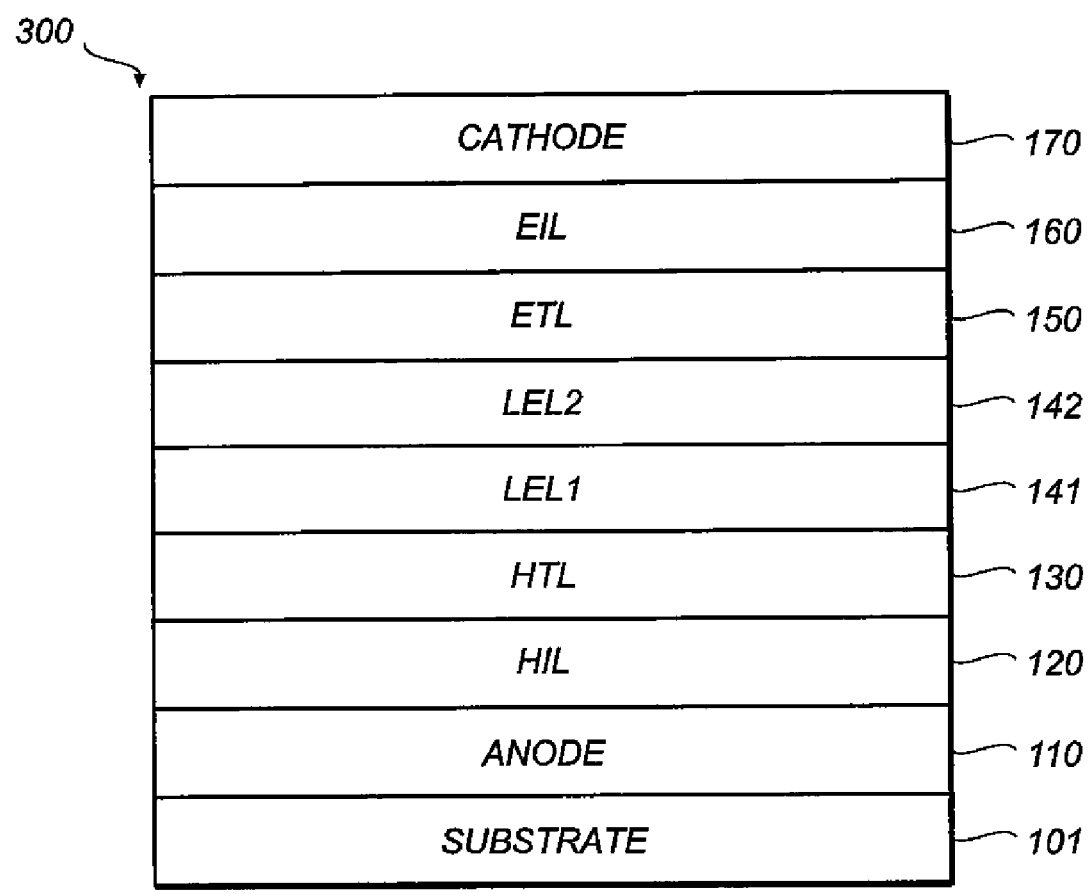

It will be understood that FIGS. 1-3 are not to scale since the individual layers are too thin and the thickness differences of various layers too great to permit depiction to scale.

DETAILED DESCRIPTION OF THE INVENTION

Several terms to be used in the following description are explained herein. The term "full color" is employed to describe the emission color in the red, green, and blue regions of the visible spectrum. The red, green, and blue colors constitute the three primary colors from which other colors can be produced by appropriate mixing. Broadband emission is light that has significant components in multiple portions of the visible spectrum, for example, blue and green. Broadband emission can also include the situation where light is emitted in the red, green, and blue portions of the spectrum in order to produce white light. White light is that light that is perceived by a user as having a white color, or light that has an emission spectrum sufficient to be used in combination with color filters to produce a practical full color display. Although the white light can have a strong hue and still be useful, preferably, white color has Commission International de l'Eclairage (CIE) coordinates of about CIE x=0.31±0.05 and CIE y=0.33±0.05. This color is a $D_{65}$ white, which is particularly advantageous for RGBW displays having red, green, blue, and white pixels as described in WO 2004/061963. The term "pixel" is employed in its art-recognized usage to designate an area of a display panel that can be stimulated to emit light independently.

Turning to FIG. 1, a typical organic light-emitting device 100 has a substrate 101 on which is disposed an anode 110. An organic light-emitting structure is formed between the anode 110 and a cathode 170. The organic light-emitting structure is comprised of, in sequence, a hole-injection layer 120, an organic hole-transporting layer 130, an organic light-emitting layer 140, an organic electron-transporting layer 150 and an electron injection layer 160. When an electrical potential difference (not shown) is applied between the anode 110 and the cathode 170, the cathode will inject electrons into the electron-transporting layer 150, and the electrons will migrate across layer 150 to the light-emitting layer 140. At the same time, holes will be injected from the anode 110 into the hole-transporting layer 130. The holes will migrate across layer 130 and recombine with electrons at or near a junction formed between the hole-transporting layer 130 and the light-emitting layer 140. When a migrating electron drops from its conduction band to a valance band in filling a hole, energy is released as light, which is emitted through the light-transmissive anode 110 and substrate.

Turning now to FIG. 2, there is shown a cross-sectional view of a pixel of a light-emitting OLED device 200 that can be used according to a first embodiment of the present invention. The structure is similar to OLED device 100 except that it includes two distinct light-emitting layers: first light-emitting layer 141 (LEL1) and second light-emitting layer 142 (LEL2). In a white emitting OLED device, typically the first light-emitting layer (LEL1) has a yellow-red emission and the second emitting layer (LEL2) has a blue or bluish-green emission. Alternatively, the LEL1 can be blue emitting and LEL2 can be yellow-red emitting.

Turning now to FIG. 3, there is shown a cross-sectional view of a pixel of a light-emitting OLED device 300 that can be used according to a second embodiment of the present invention. It also includes the substrate 101 onto which are deposited the following layers in sequence: anode 110, hole injecting layer (HIL) 120, hole transporting layer (HTL) 130, first light emitting layer (LEL1) 141, second light-emitting layer (LEL2) 142, electron transporting layer (ETL) 150, electron injecting layer (EIL) 160, and cathode 170.

The components of the above OLED structures will be described in more detail in the following paragraphs.

Substrate 101 can be an organic solid, an inorganic solid, or include organic and inorganic solids. Substrate 101 can be rigid or flexible and can be processed as separate individual pieces, such as sheets or wafers, or as a continuous roll. Typical substrate materials include glass, plastic, metal, ceramic, semiconductor, metal oxide, semiconductor oxide, semiconductor nitride, or combinations thereof. Substrate 101 can be a homogeneous mixture of materials, a composite of materials, or multiple layers of materials. Substrate 101 can be an OLED substrate, that is a substrate commonly used for preparing OLED devices, e.g. active matrix low temperature polycrystalline silicon or amorphous-silicon TFT substrate. The substrate 101 can either be light transmissive or opaque, depending on the intended direction of light emission. The light transmissive property is desirable for viewing the EL emission through the substrate. Transparent glass or plastic is commonly employed in such cases. For applications where the EL emission is viewed through the top electrode, the transmissive characteristic of the bottom support is immaterial, and therefore can be light transmissive, light absorbing, or light reflective. Substrates for use in this case include, but are not limited to, glass, plastic, metal, semiconductor materials, ceramics, and circuit board materials, or any others commonly used in the formation of OLED devices, which can be either passive matrix devices or active matrix devices.

An electrode is formed over substrate 101 and is most commonly configured as an anode 110. However, the OLED devices of this invention are not limited to this configuration, and can instead have a cathode as the first electrode. For the purposes of this discussion, the electrode adjacent to the substrate is considered the anode. When EL emission is viewed through the substrate 101, anode 110 should be transparent or substantially transparent to the emission of interest. Common transparent anode materials useful in the present invention are indium-tin oxide (ITO), indium-zinc oxide (IZO) and tin oxide, but other metal oxides can work including, but not limited to, aluminum- or indium-doped zinc oxide, magnesium-indium oxide, and nickel-tungsten oxide. In addition to these oxides, metal nitrides such as gallium nitride, metal selenides such as zinc selenide, and metal sulfides such as zinc sulfide, can be used as an anode material. For applications where EL emission is viewed through the top electrode, the transmissive characteristics of the anode material are immaterial and any conductive material can be used, transparent, opaque or reflective. Example conductors for this application include, but are not limited to, gold, iridium, molybdenum, palladium, and platinum. The preferred anode materials, transmissive or otherwise, have a work function of no less than 4.0 eV. Desired anode materials are commonly deposited by any suitable way such as evaporation, sputtering, chemical vapor deposition, or electrochemical means. Anodes can be patterned using traditional photolithographic processes. Optionally, anodes can be polished prior to the deposition of other layers to reduce surface roughness so as to reduce electrical shorts or enhance reflectivity.

Although not always necessary, it is often useful that a hole-injecting layer 120 be formed over anode 110 in an organic light-emitting display. The hole-injecting material can serve to improve the film formation property of subsequent organic layers and to facilitate injection of holes into the hole-transporting layer. Suitable materials for use in the hole-injecting layer include, but are not limited to, porphyrinic compounds as described in U.S. Pat. No. 4,720,432, plasma-deposited fluorocarbon polymers as described in U.S. Pat. Nos. 6,127,004, 6,208,075, and 6,208,077, some aromatic amines, for example, m-MTDATA (4,4',4"-tris[(3-methylphenyl)phenyl-amino]triphenylamine), and inorganic oxides including vanadium oxide (VOx), molybdenum oxide (MoOx), and nickel oxide (NiOx). Alternative hole-injecting materials reportedly useful in organic EL devices are described in EP 0 891 121 A1 and EP 1 029 909 A1.

Hexaazatriphenylene derivatives, as described in U.S. Pat. No. 6,720,573, and some other hole-injection materials described in U.S. patent application Ser. No. 11/064,386 filed Feb. 11, 2005 by Liang-Sheng Liao et al., entitled "Tandem OLEDs having Organic Intermediate Connector" are also a useful class of hole-injecting materials. These organic materials have been found to have dual purpose as organic connector and hole-injection layer or electron accepting layer.

The organic materials for the hole-injection layer can include a chemical compound of the following formula:

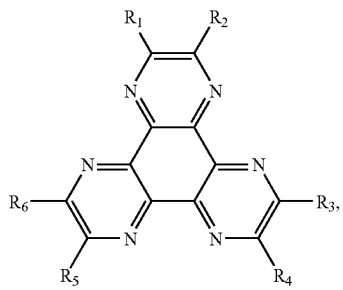

wherein $R_1$-$R_6$ represent hydrogen or a substituent independently selected from the group including halo, nitrile (—CN), nitro (—NO$_2$), sulfonyl (—SO$_2$R), sulfoxide (—SOR), trifluoromethyl (—CF$_3$), ester (—CO—OR), amide (—CO—NHR or —CO—NRR'), substituted or unsubstituted aryl, substituted or unsubstituted heteroaryl, and substituted or unsubstituted alkyl, where R and R' include substituted or unsubstituted alkyl or aryl; or wherein $R_1$ and $R_2$, $R_3$ and $R_4$, or $R_5$, and $R_6$ combine form a ring structure including an aromatic ring, a heteroaromatic ring, or a nonaromatic ring, and each ring is substituted or unsubstituted. The specific organic materials used as hole-injection layer include

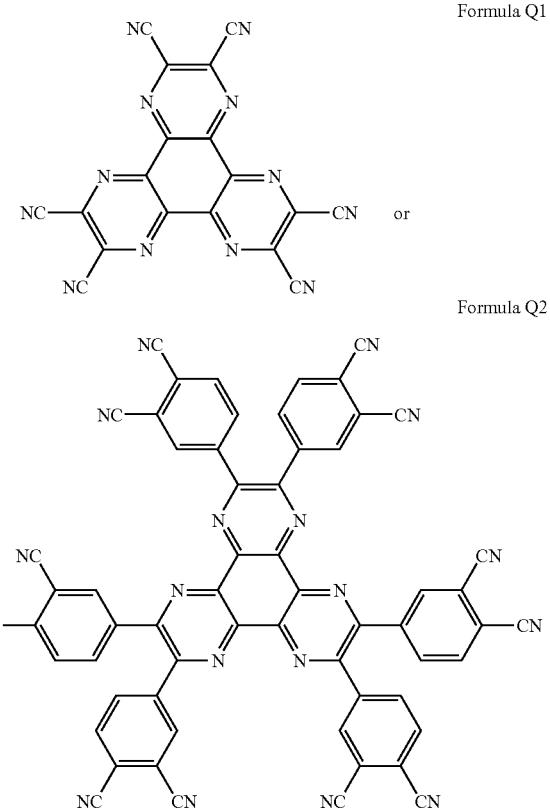

Hexaazatriphenylene derivatives may also be useful as hole-transporting (HTL) materials. In this case, these materials serve a dual purpose as hole-injecting and hole-transporting materials.

A hole-transporting layer 130 is formed and disposed over anode 110. Desired hole-transporting materials can be deposited by any suitable way such as evaporation, sputtering, chemical vapor deposition, electrochemical means, thermal transfer, or laser thermal transfer from a donor material. Typical hole-transporting materials useful in a hole-transporting layer are well known to include compounds such as an aromatic tertiary amine, where the latter is understood to be a compound containing at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or a polymeric arylamine. Exemplary monomeric triarylamines are illustrated by Klupfel et al. in U.S. Pat. No. 3,180,730. Other suitable triarylamines substituted with one or more vinyl radicals and/or comprising at least one active hydrogen-containing group are disclosed by Brantley et al. in U.S. Pat. Nos. 3,567,450 and 3,658,520.

A more preferred class of aromatic tertiary amines is that which includes at least two aromatic tertiary amine moieties as described in U.S. Pat. Nos. 4,720,432 and 5,061,569. Such compounds include those represented by structural Formula A

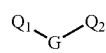

wherein:
  $Q_1$ and $Q_2$ are independently selected aromatic tertiary amine moieties; and
  G is a linking group such as an arylene, cycloalkylene, or alkylene group of a carbon to carbon bond.

In one embodiment, at least one of $Q_1$ or $Q_2$ contains a polycyclic fused ring structure, e.g., a naphthalene moiety. When G is an aryl group, it is conveniently a phenylene, biphenylene, or naphthalene moiety.

A useful class of triarylamines satisfying structural Formula A and containing two triarylamine moieties is represented by structural Formula B

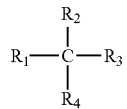

where:
  $R_1$ and $R_2$ each independently represent a hydrogen atom, an aryl group, or an alkyl group or $R_1$ and $R_2$ together represent the atoms completing a cycloalkyl group; and
  $R_3$ and $R_4$ each independently represent an aryl group, which is in turn substituted with a diaryl substituted amino group, as indicated by structural Formula C

wherein $R_5$ and $R_6$ are independently selected aryl groups. In one embodiment, at least one of $R_5$ or $R_6$ contains a polycyclic fused ring structure, e.g., a naphthalene.

Another class of aromatic tertiary amines is the tetraaryldiamines. Desirable tetraaryldiamines include two diarylamino groups, such as indicated by Formula C, linked through an arylene group. Useful tetraaryldiamines include those represented by Formula D

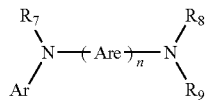

D wherein:
 each Are is an independently selected arylene group, such as a phenylene or anthracene moiety;
 n is an integer of from 1 to 4; and
 Ar, $R_7$, $R_8$, and $R_9$ are independently selected aryl groups. In a typical embodiment, at least one of Ar, $R_7$, $R_8$, and $R_9$ is a polycyclic fused ring structure, e.g., a naphthalene.

The various alkyl, alkylene, aryl, and arylene moieties of the foregoing structural Formulae A, B, C, D, can each in turn be substituted. Typical substituents include alkyl groups, alkoxy groups, aryl groups, aryloxy groups, and halides such as fluoride, chloride, and bromide. The various alkyl and alkylene moieties typically contain from 1 to about 6 carbon atoms. The cycloalkyl moieties can contain from 3 to about 10 carbon atoms, but typically contain five, six, or seven carbon atoms e.g., cyclopentyl, cyclohexyl, and cycloheptyl ring structures. The aryl and arylene moieties are usually phenyl and phenylene moieties.

The hole-transporting layer in an OLED device can be formed of a single or a mixture of aromatic tertiary amine compound(s). Specifically, one can employ a triarylamine, such as a triarylamine satisfying the Formula B, in combination with a tetraaryldiamine, such as indicated by Formula D. Illustrative of useful aromatic tertiary amines are the following:

1,1-Bis(4-di-p-tolylaminophenyl)cyclohexane;
1,1-Bis(4-di-p-tolylaminophenyl)-4-phenylcyclohexane;
N,N,N',N'-tetraphenyl-4,4'''-diamino-1,1':4',1'':4'',1'''-quaterphenyl;
Bis(4-dimethylamino-2-methylphenyl)phenylmethane;
1,4-bis[2-[4-[N,N-di(p-tolyl)amino]phenyl]vinyl]benzene (BDTAPVB);
N,N,N',N'-Tetra-p-tolyl-4,4'-diaminobiphenyl;
N,N,N',N'-Tetraphenyl-4,4'-diaminobiphenyl;
N,N,N',N'-tetra-1-naphthyl-4,4'-diaminobiphenyl;
N,N,N',N'-tetra-2-naphthyl-4,4'-diaminobiphenyl;
N-Phenylcarbazole;
4,4'-Bis[N-(1-naphthyl)-N-phenylamino]biphenyl (NPB);
4,4'-Bis[N-(1-naphthyl)-N-(2-naphthyl)amino]biphenyl (TNB);
4,4'-Bis[N-(1-naphthyl)-N-phenylamino]p-terphenyl;
4,4'-Bis[N-(2-naphthyl)-N-phenylamino]biphenyl;
4,4'-Bis[N-(3-acenaphthenyl)-N-phenylamino]biphenyl;
1,5-Bis[N-(1-naphthyl)-N-phenylamino]naphthalene;
4,4'-Bis[N-(9-anthryl)-N-phenylamino]biphenyl;
4,4'-Bis[N-(1-anthryl)-N-phenylamino]-p-terphenyl;
4,4'-Bis[N-(2-phenanthryl)-N-phenylamino]biphenyl;
4,4'-Bis[N-(8-fluoranthenyl)-N-phenylamino]biphenyl;
4,4'-Bis[N-(2-pyrenyl)-N-phenylamino]biphenyl;
4,4'-Bis[N-(2-naphthacenyl)-N-phenylamino]biphenyl;
4,4'-Bis[N-(2-perylenyl)-N-phenylamino]biphenyl;
4,4'-Bis[N-(1-coronenyl)-N-phenylamino]biphenyl;
2,6-Bis(di-p-tolylamino)naphthalene;
2,6-Bis[di-(1-naphthyl)amino]naphthalene;
2,6-Bis[N-(1-naphthyl)-N-(2-naphthyl)amino]naphthalene;
N,N,N',N'-Tetra(2-naphthyl)-4,4'''-diamino-p-terphenyl;
4,4'-Bis{N-phenyl-N-[4-(1-naphthyl)-phenyl]amino}biphenyl;
2,6-Bis[N,N-di(2-naphthyl)amino]fluorene;
4,4',4''-tris[(3-methylphenyl)phenylamino]triphenylamine(MTDATA); and
4,4'-Bis[N-(3-methylphenyl)-N-phenylamino]biphenyl (TPD).

Another class of useful hole-transporting materials includes polycyclic aromatic compounds as described in EP 1 009 041. In addition, polymeric hole-transporting materials can be used such as poly(N-vinylcarbazole) (PVK), polythiophenes, polypyrrole, polyaniline, and copolymers such as poly(3,4-ethylenedioxythiophene)/poly(4-styrenesulfonate) also called PEDOT/PSS.

Although the materials listed above may be useful in a typical OLED device operating at ambient conditions, some may not be useful as a single compound layer when operated at higher temperature conditions (such as greater than 85° C.) because the materials may begin to decompose. For the purpose of this invention, the hole-transporting material in layer 130 should include as a main component, a material that is thermally stable and has a higher Tg than that of the material forming the main component of the adjacent LEL.

The thickness of the hole-transporting layer can advantageously be in a range of 5 nm-260 nm. Preferably, the thickness of the hole transport layer is less than 40 nm and greater than 5 nm.

US patent application US2005/0106419 A1 discusses spiro materials as hole-transporting layers. These materials have a Tg>130° C. and can effectively be used in layer 130 (HTL) of the present invention. The structure formulae of these materials are given below. Spiro-TAD (2,2',7,7'-tetrakis(diphenylamino)spiro-9,9'-bifluorene) and spiro-NPB are examples of useful hole transport materials:

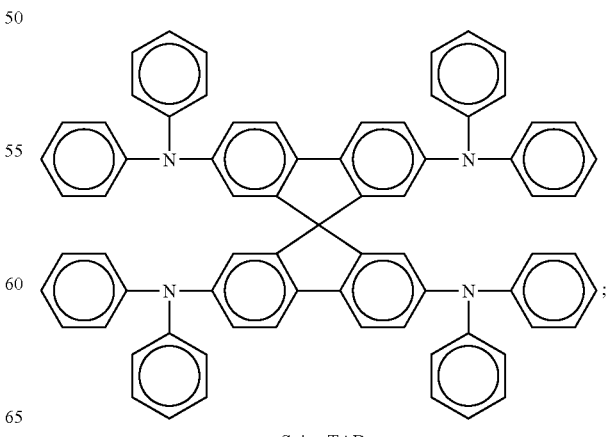

Spiro-TAD

-continued

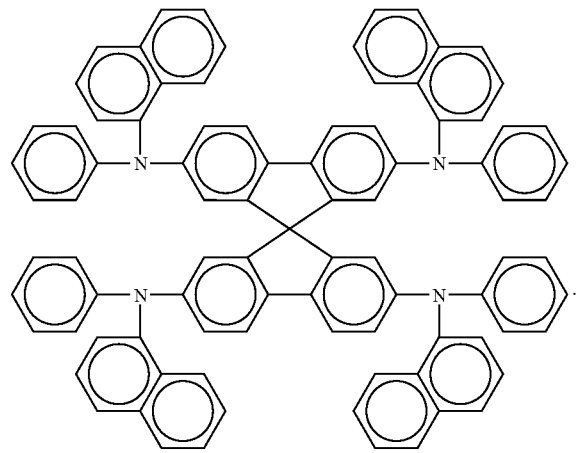

Spiro-NPB

Some other hole-transporting materials useful for this invention are described in U.S. patent application Ser. No. 11/172,024 filed Jun. 30, 2005 by Wojciech Kazimierz Slusarek, et al., entitled "Electroluminescent Devices Containing Benzidine Derivatives". 4,4'-Bis[N-(1-naphthyl)-N-(2-naphthyl)amino]biphenyl (TNB) is one example of a useful hole-transporting material with a high Tg (134° C.). Other iso-TNB derivatives also have a high Tg and can therefore be useful in HTL layer 130. The structures of these materials are shown below:

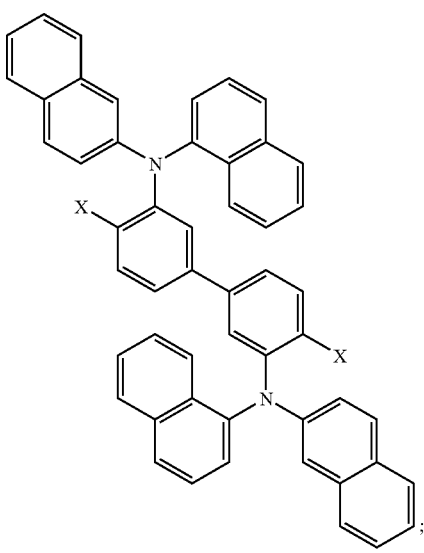

wherein X = H (Tg = 122° C.), or X = OCH₃ (Tg = 137° C.)

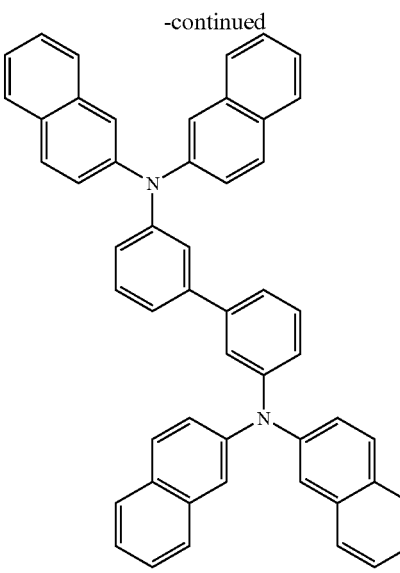

Tg = 118° C.

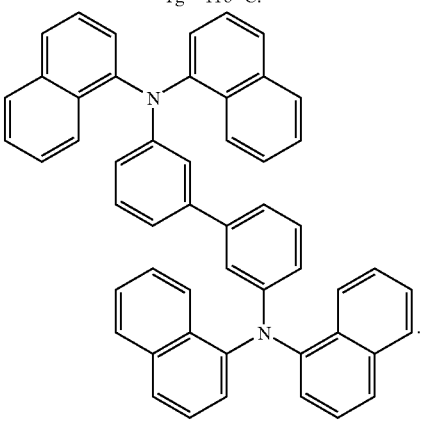

Tg = 144° C.

First light-emitting layer 141 is provided over hole-transporting layer 130 and includes a first host material and a first light-emitting material. The first host material is preferably a hole-transporting material, which has a Tg lower than that of the hole-transporting material contained in the adjacent HTL layer 130. First and second light-emitting layers (LEL1) 141 and (LEL2) 142, respectively, produce light in response to hole-electron recombination and are commonly disposed over hole-transporting layer 130. Desired organic light-emitting materials can be deposited by any suitable way such as evaporation, sputtering, chemical vapor deposition, electrochemical means, or radiation thermal transfer from a donor material. Useful organic light-emitting materials are well known. As more fully described in U.S. Pat. Nos. 4,769,292 and 5,935,721, each of the light-emitting layers of the organic EL element includes a luminescent or fluorescent material where electroluminescence is produced as a result of electron-hole pair recombination in this region. It is also possible for recombination in one light-emitting layer to produce luminescence in another light-emitting layer by way of an energy transfer process. While light-emitting layers can be comprised of a single material, they more commonly include a host material doped with a guest compound or dopant where light emission comes primarily from the dopant. The practice of this invention concerns such host/dopant light-emitting layers and OLED devices. The dopant is selected to produce color light having a particular spectrum. The dopant is usually chosen from highly fluorescent dyes, and is typically coated as 0.01 to 10% by weight into the host material.

An important relationship for choosing a dye as a dopant is the value of the optical band gap, which is defined the energy difference between the emissive excited state and the ground state of the molecule and is approximately equal to the energy difference between the lowest unoccupied molecular orbital and the highest occupied molecular orbital of the molecule. For efficient energy transfer from the host material to the dopant molecule, or to prevent back-transfer of energy from the dopant to the host, a necessary condition is that the band gap of the dopant be smaller than that of the host material.

Host and emitting materials known to be of use include, but are not limited to, those disclosed in U.S. Pat. Nos. 4,768,292; 5,141,671; 5,150,006; 5,151,629; 5,405,709; 5,484,922; 5,593,788; 5,645,948; 5,683,823; 5,755,999; 5,928,802; 5,935,720; 5,935,721; 6,020,078; 6,475,648; 6,534,199; 6,661,023; U.S. Patent Application Publications 2002/0127427 A1; 2003/0198829 A1; 2003/0203234 A1; 2003/0224202 A1; and 2004/0001969 A1.

First light-emitting layer 141 is provided over hole-transporting layer 130 and includes a first host material and a first light-emitting material. The first host material is preferably a hole-transporting material, which has a Tg lower than that of the hole-transporting material contained in the adjacent HTL layer 130. The first host material in LEL1 may be a single component or a mixture of one or more components, with the hole-transporting material being the main component, or the highest in terms of % volume. The first host material may be a mixture of one or more mono-anthracene derivatives provided in a volume fraction range of 5% to 50% relative to the total host volume, and one or more hole-transporting aromatic amine derivatives as the main component provided in a volume fraction range of 50% to 95% relative to the total host volume.

The mono-anthracene derivative(s) in the first light-emitting layer can be derivatives of a single anthracene nucleus having hydrocarbon or substituted hydrocarbon substituents at the 9 and 10 positions. For example, derivatives of 9,10-di-(2-naphthyl)anthracene (Formula F) constitute one class of useful host materials capable of supporting electroluminescence, and are particularly suitable for light emission of wavelengths longer than 400 nm, e.g., blue, green, yellow, orange or red

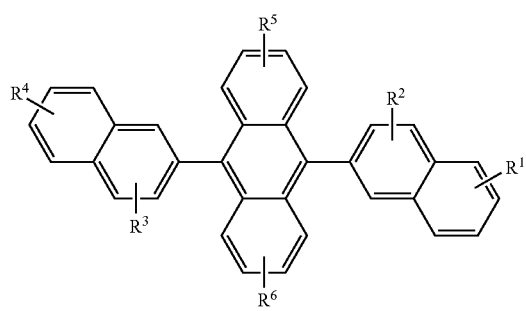

F wherein $R^1$, $R^2$, $R^3$, $R^4$, $R^5$, and $R^6$ represent one or more substituents on each ring where each substituent is individually selected from the following groups:

Group 1: hydrogen, or alkyl of from 1 to 24 carbon atoms;
Group 2: aryl or substituted aryl of from 5 to 20 carbon atoms;
Group 3: carbon atoms from 4 to 24 necessary to complete a fused aromatic ring of anthracenyl, pyrenyl, or perylenyl;
Group 4: heteroaryl or substituted heteroaryl of from 5 to 24 carbon atoms as necessary to complete a fused heteroaromatic ring of furyl, thienyl, pyridyl, quinolinyl or other heterocyclic systems;
Group 5: alkoxylamino, alkylamino, or arylamino of from 1 to 24 carbon atoms; and
Group 6: fluorine, chlorine, bromine or cyano.

The mono-anthracene derivative of Formula (I) is also a useful host material capable of supporting electroluminescence, and is particularly suitable for light emission of wavelengths longer than 400 nm, e.g., blue, green, yellow, orange or red. Mono-anthracene derivatives of Formula (I) are described in commonly assigned U.S. patent application Ser. No. 10/693,121 filed Oct. 24, 2003 by Lelia Cosimbescu et al., entitled "Electroluminescent Device With Anthracene Derivative Host", the disclosure of which is herein incorporated by reference

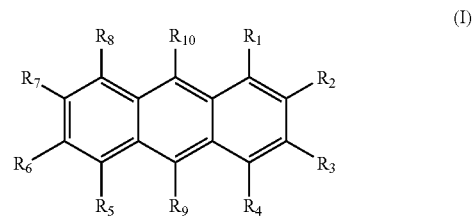

(I)

wherein:
$R_1$-$R_8$ are H; and
$R_9$ is a naphthyl group containing no fused rings with aliphatic carbon ring members; provided that $R_9$ and $R_{10}$ are not the same, and are free of amines and sulfur compounds. Suitably, $R_9$ is a substituted naphthyl group with one or more further fused rings such that it forms a fused aromatic ring system, including a phenanthryl, pyrenyl, fluoranthene, perylene, or substituted with one or more substituents including fluorine, cyano group, hydroxy, alkyl, alkoxy, aryloxy, aryl, a heterocyclic oxy group, carboxy, trimethylsilyl group, or an unsubstituted naphthyl group of two fused rings. Conveniently, $R_9$ is 2-naphthyl, or 1-naphthyl substituted or unsubstituted in the para position; and
$R_{10}$ is a biphenyl group having no fused rings with aliphatic carbon ring members. Suitably $R_{10}$ is a substituted biphenyl group, such that it forms a fused aromatic ring system including but not limited to a naphthyl, phenanthryl, perylene, or substituted with one or more substituents including fluorine, cyano group, hydroxy, alkyl, alkoxy, aryloxy, aryl, a heterocyclic oxy group, carboxy, trimethylsilyl group, or an unsubstituted biphenyl group. Conveniently, $R_{10}$ is 4-biphenyl, 3-biphenyl unsubstituted or substituted with another phenyl ring without fused rings to form a terphenyl ring system, or 2-biphenyl. Particularly useful is 9-(2-naphthyl)-10-(4-biphenyl)anthracene.

Some examples of useful mono-anthracene materials for use in a light-emitting layer include:

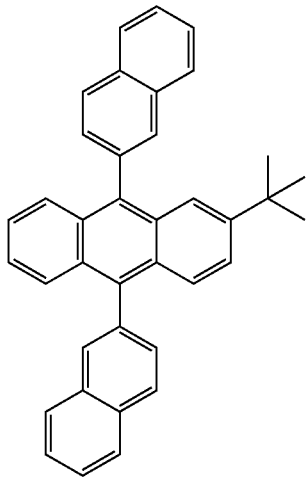
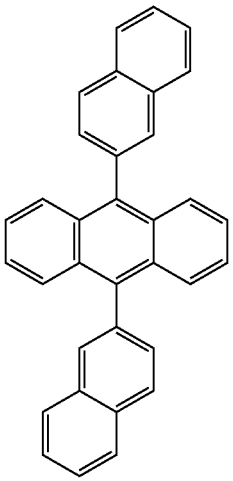
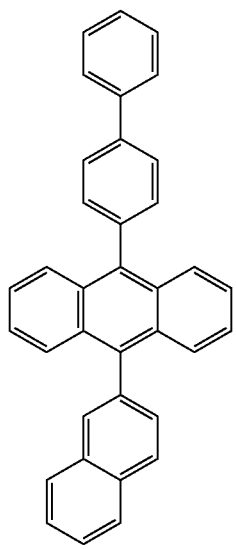
AH1 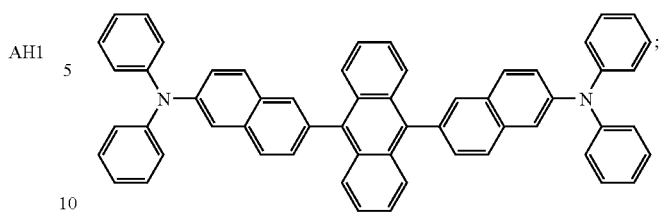
AH4 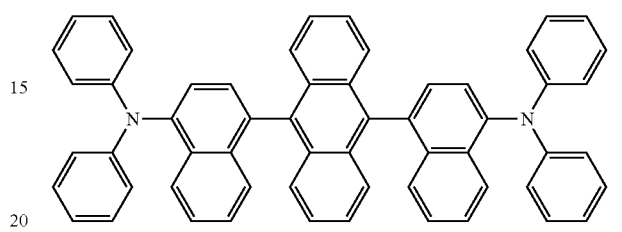
AH5 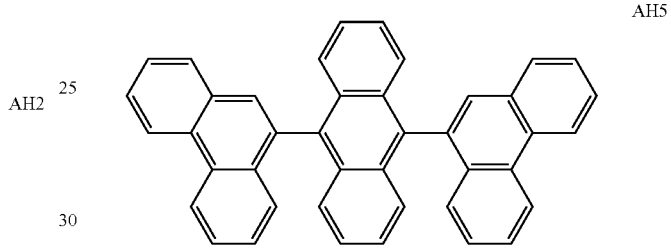
AH6 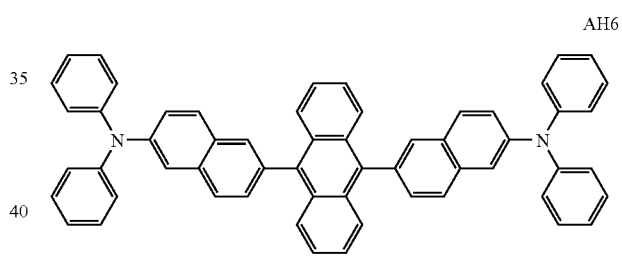
AH2
AH3
AH7 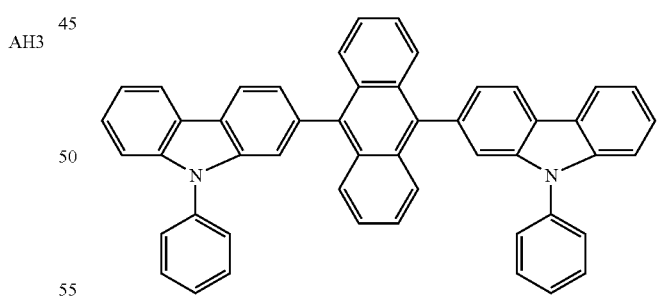
AH8 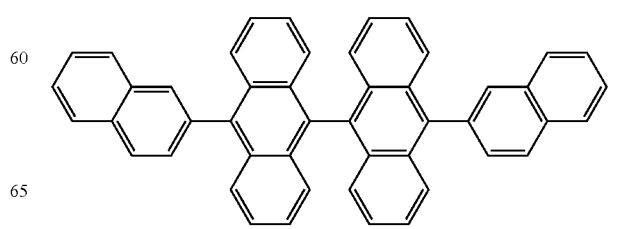

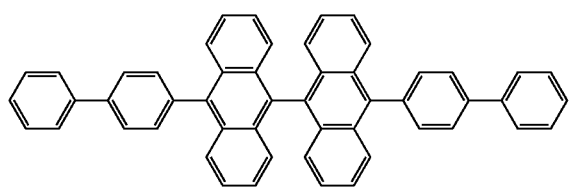

AH9

Desirable fluorescent dopants include perylene or derivatives of perylene, derivatives of anthracene, tetracene, xanthene, rubrene, coumarin, rhodamine, quinacridone, dicyanomethylenepyran compounds, thiopyran compounds, polymethine compounds, pyrylium and thiapyrylium compounds, derivatives of distryrylbenzene or distyrylbiphenyl, bis(azinyl) methane boron complex compounds, and carbostyryl compounds. Illustrative examples of useful dopants include, but are not limited to, the following:

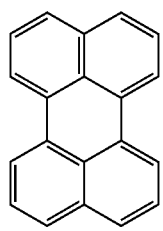

L1

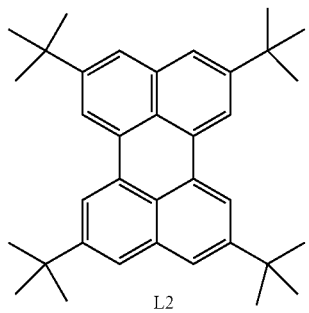

L2

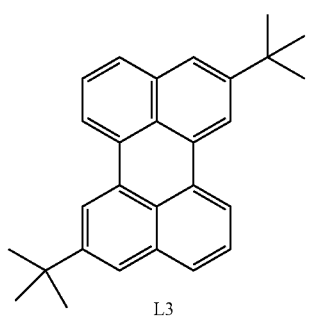

L3

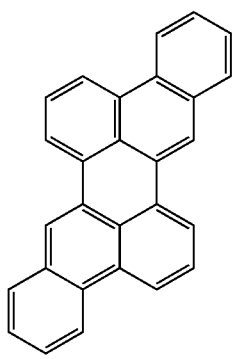

L4

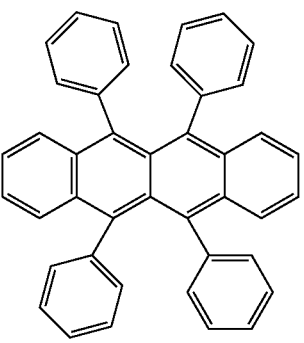

L5

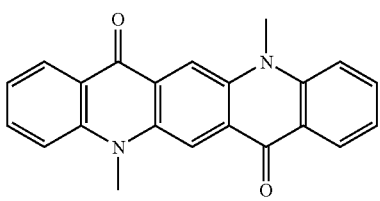

L6

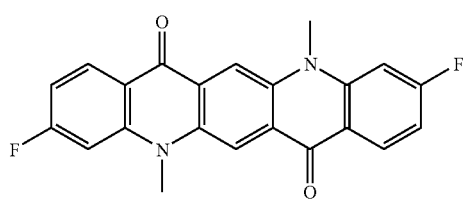

L7

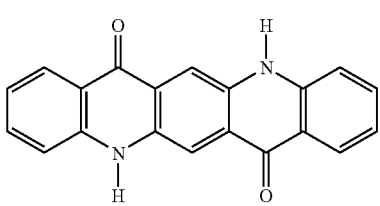

L8

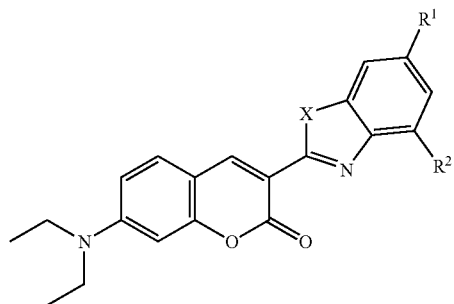

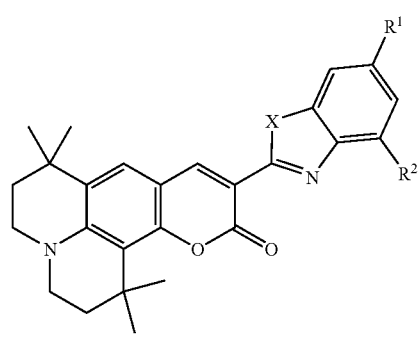

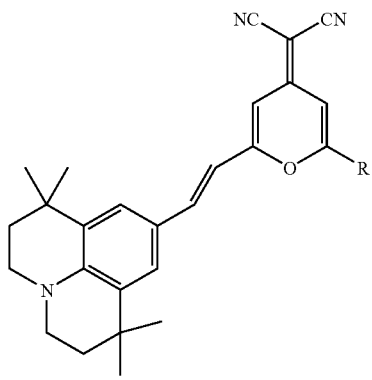

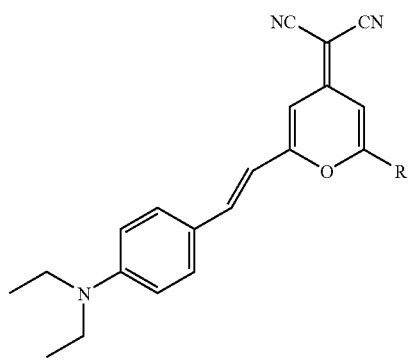

|  | X | R1 | R2 |
|---|---|---|---|
| L9 | O | H | H |
| L10 | O | H | Methyl |
| L11 | O | Methyl | H |
| L12 | O | Methyl | Methyl |
| L13 | O | H | t-butyl |
| L14 | O | t-butyl | H |
| L15 | O | t-butyl | t-butyl |
| L16 | S | H | H |
| L17 | S | H | Methyl |
| L18 | S | Methyl | H |
| L19 | S | Methyl | Methyl |
| L20 | S | H | t-butyl |
| L21 | S | t-butyl | H |
| L22 | S | t-butyl | t-butyl |
| L23 | O | H | H |
| L24 | O | H | Methyl |
| L25 | O | Methyl | H |
| L26 | O | Methyl | Methyl |
| L27 | O | H | t-butyl |
| L28 | O | t-butyl | H |
| L29 | O | t-butyl | t-butyl |
| L30 | S | H | H |
| L31 | S | H | Methyl |
| L32 | S | Methyl | H |
| L33 | S | Methyl | Methyl |
| L34 | S | H | t-butyl |
| L35 | S | t-butyl | H |
| L36 | S | t-butyl | t-butyl |

|  | R |
|---|---|
| L37 | Phenyl |
| L38 | Methyl |
| L39 | t-butyl |
| L40 | Mesityl |
| L41 | phenyl |
| L42 | methyl |
| L43 | t-butyl |
| L44 | mesityl |

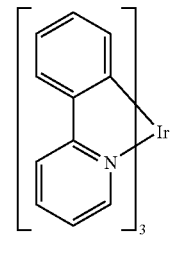

L45

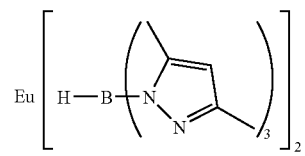

L46

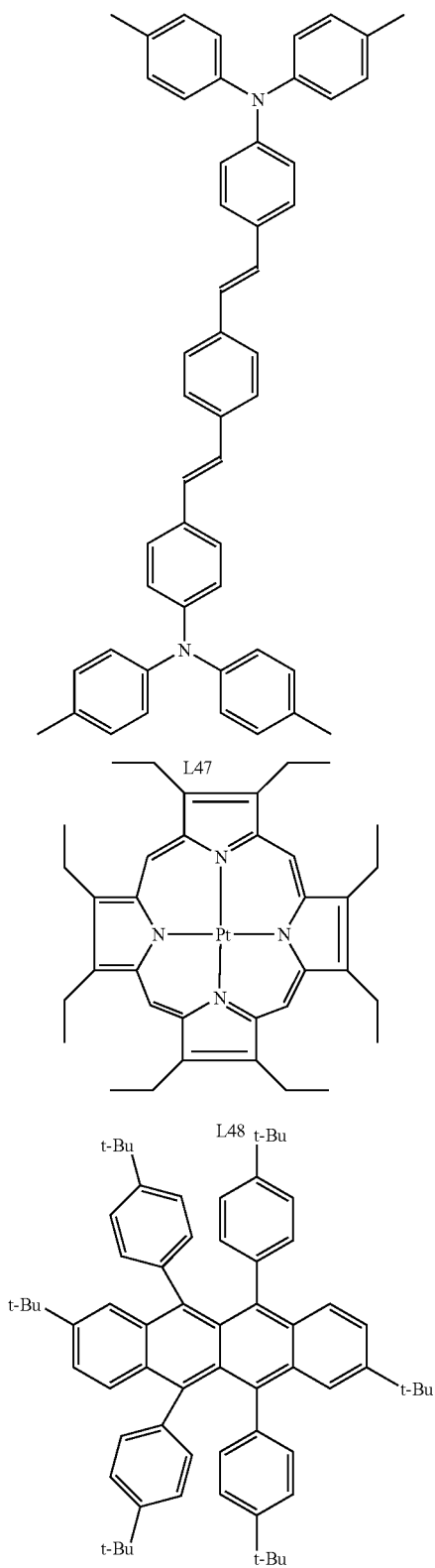

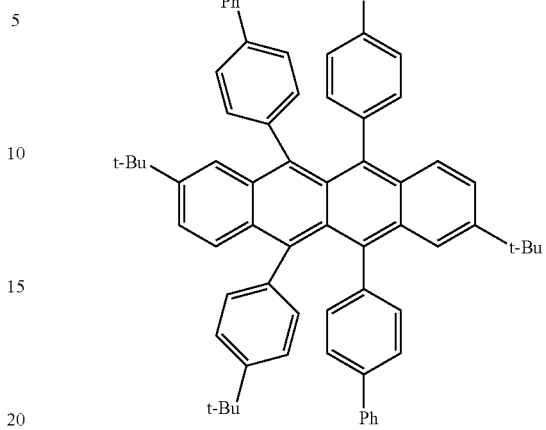

Other organic emissive materials can be polymeric substances, e.g. polyphenylenevinylene derivatives, dialkoxy-polyphenylenevinylenes, poly-para-phenylene derivatives, and polyfluorene derivatives, as taught by Wolk et al. in commonly assigned U.S. Pat. No. 6,194,119 B1 and references cited therein. First light-emitting layer 141 includes a first light-emitting material. In a preferred embodiment, first light-emitting layer can have a peak emission in the yellow to red portion of the visible spectrum, and therefore the first light-emitting material can be a light-emitting yellow, orange, or red dopant. A light-emitting yellow or orange dopant can include a compound of the following structures:

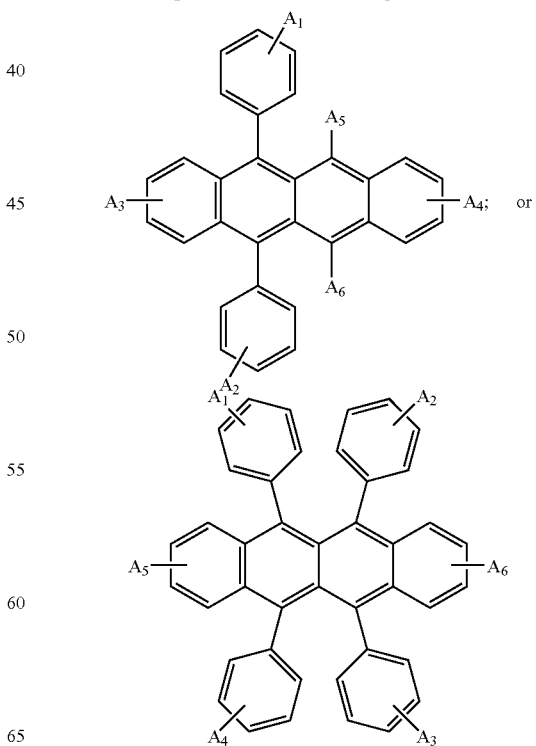

wherein $A_1$-$A_6$ represent one or more substituents on each ring and where each substituent is individually selected from one of the following:

Category 1: hydrogen, or alkyl of from 1 to 24 carbon atoms;

Category 2: aryl or substituted aryl of from 5 to 20 carbon atoms;

Category 3: hydrocarbon containing 4 to 24 carbon atoms, completing a fused aromatic ring or ring system;

Category 4: heteroaryl or substituted heteroaryl of from 5 to 24 carbon atoms such as thiazolyl, furyl, thienyl, pyridyl, quinolinyl or other heterocyclic systems, which are bonded via a single bond, or complete a fused heteroaromatic ring system;

Category 5: alkoxylamino, alkylamino, or arylamino of from 1 to 24 carbon atoms; or Category 6: fluoro, chloro, bromo or cyano.

Examples of particularly useful yellow or orange dopants include 5,6,11,12-tetraphenylnaphthacene (rubrene); 6,11-diphenyl-5,12-bis(4-(6-methyl-benzothiazol-2-yl)phenyl) naphthacene (DBZR) and 5,6,11,12-tetra(2-naphthyl) Naphthacene (NR), the formulas of which are shown below:

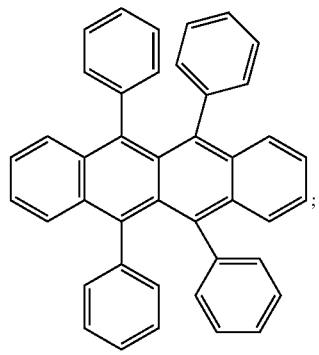

(Rubrene, P3)

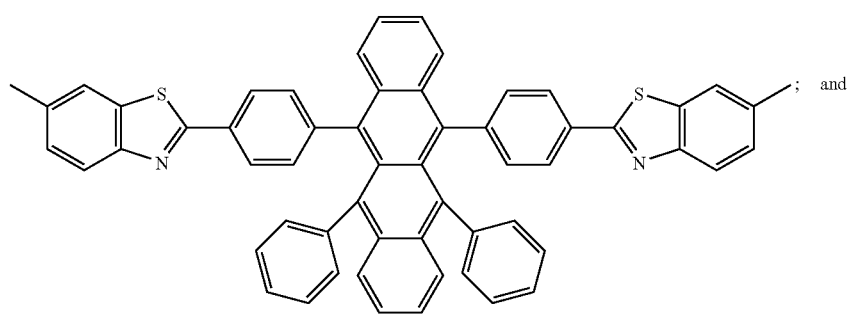

(DBzR, P5) ; and

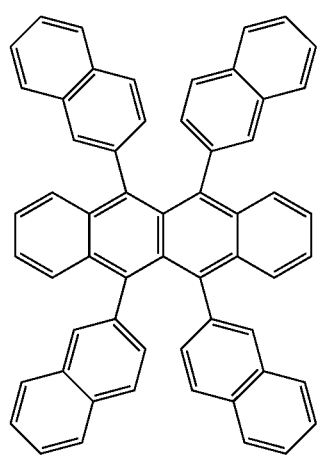

(NR, P5)

A suitable yellow or orange dopant can also be a mixture of compounds that would also be yellow or orange dopants individually.

A suitable light-emitting red dopant can include a diindenoperylene compound of the following structure Q1:

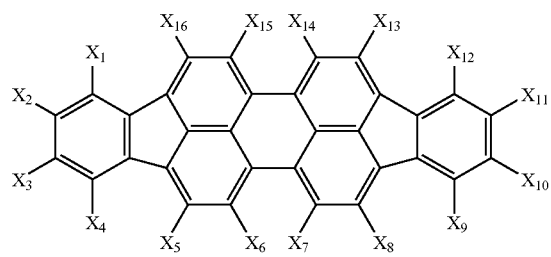

Q1 wherein $X_1$-$X_{16}$ are independently selected as hydro or substituents that provide red luminescence.

Illustrative examples of useful red dopants of this class include the following:

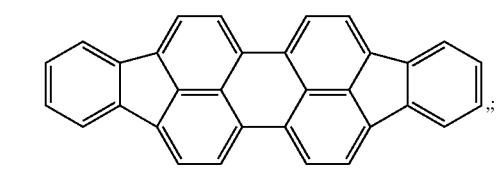

periflanthene

Q2

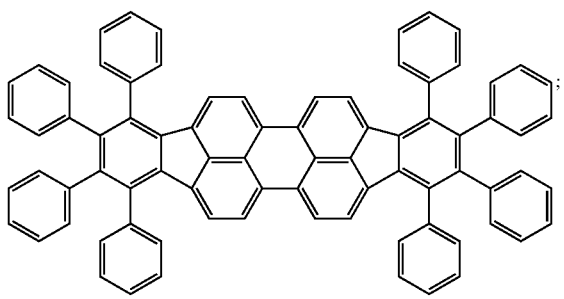

Q3

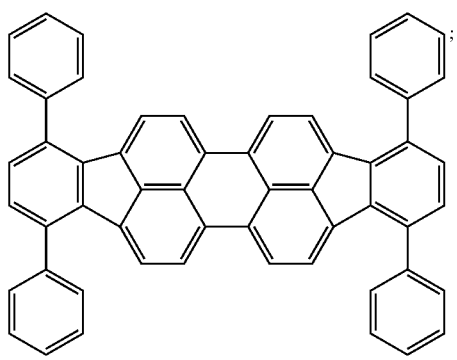

Q4

-continued

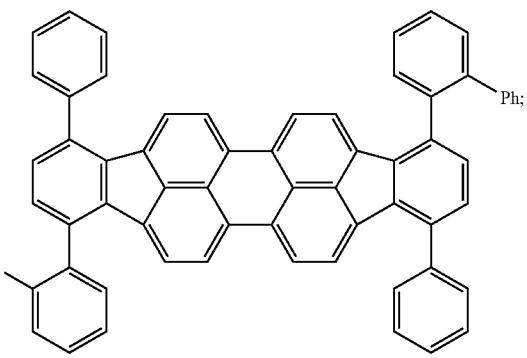

Q5

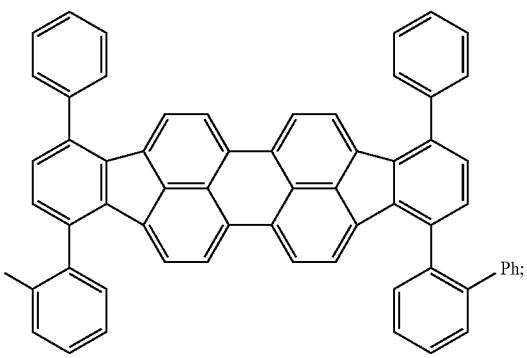

Q6

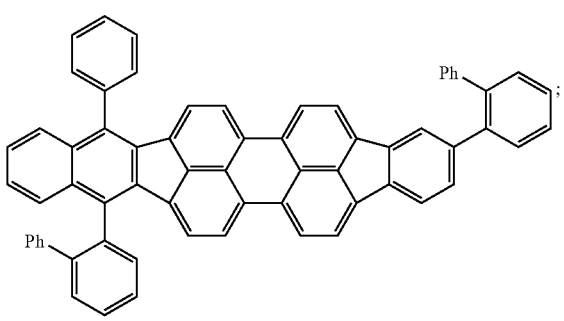

Q7

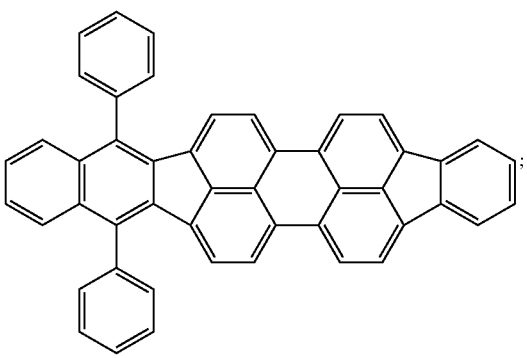

Q8

-continued

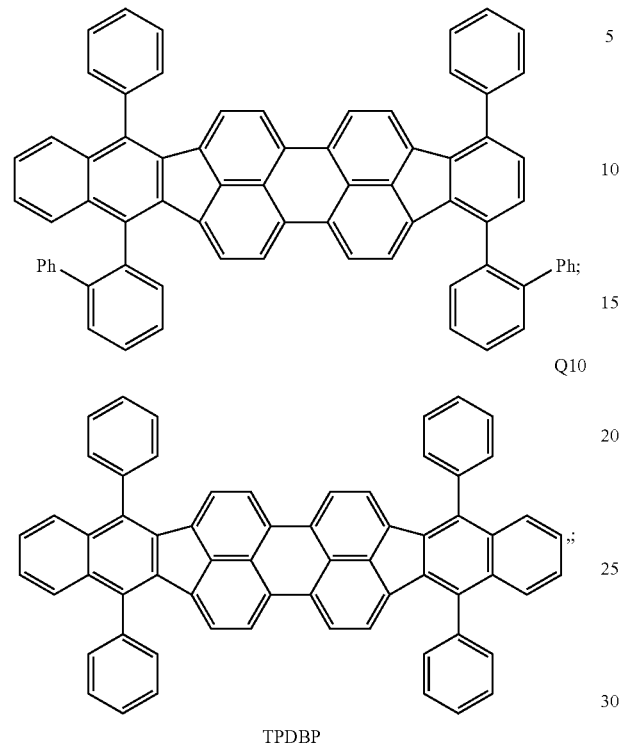

Q9

Q10

TPDBP

A particularly preferred diindenoperylene dopant is dibenzo {[f,f']-4, 4'7,7'-tetraphenyl]diindeno-[1,2,3-cd:1',2', 3'-lm]perylene (TPDBP, Q10 above).

Other red dopants useful in the present invention belong to the DCM class of dyes represented by Formula S1:

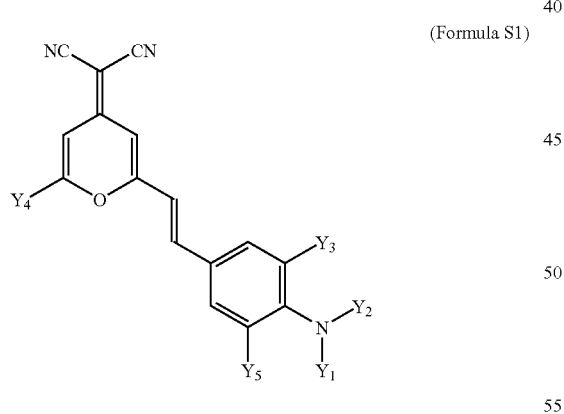

(Formula S1)

wherein:
- $Y_1$-$Y_5$ represent one or more groups independently selected from hydro, alkyl, substituted alkyl, aryl, or substituted aryl; and
- $Y_1$-$Y_5$ independently include acyclic groups or are joined pair-wise to form one or more fused rings, provided that $Y_3$ and $Y_5$ do not together form a fused ring.

In a useful and convenient embodiment that provides red luminescence, $Y_1$-$Y_5$ are selected independently from hydro, alkyl and aryl. Structures of particularly useful dopants of the DCM class are shown below:

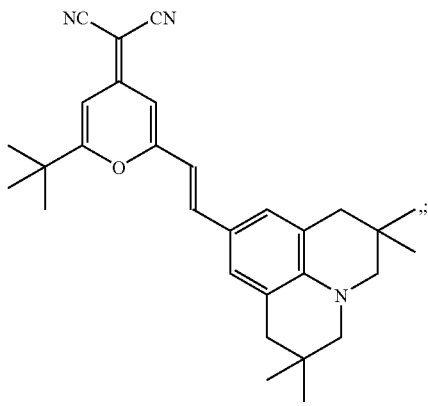

DCJTB

S2

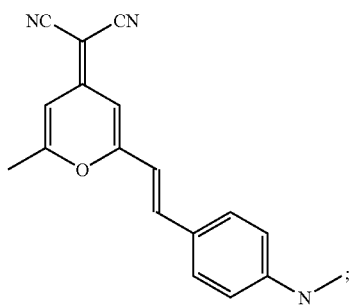

S3

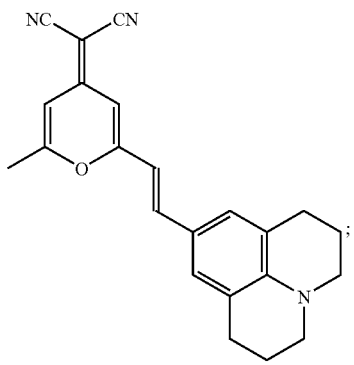

S4

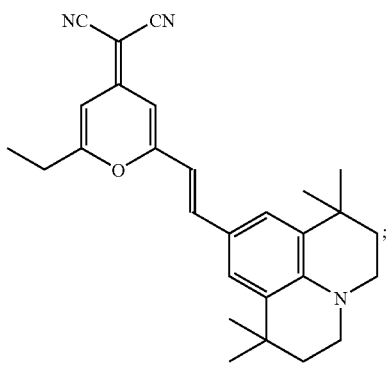

S5

-continued

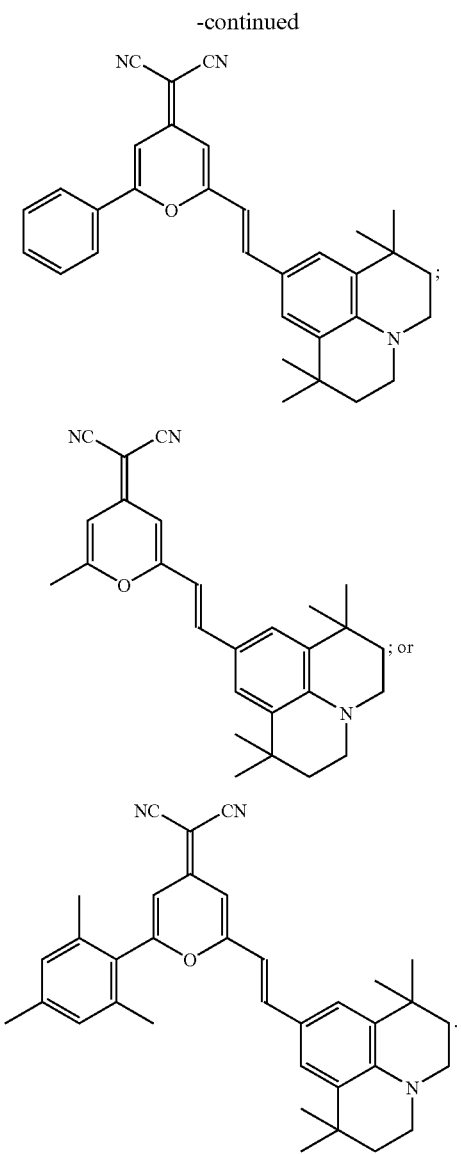

A preferred DCM dopant is DCJTB. A useful red dopant can also be a mixture of compounds that would also be red dopants individually.

In a preferred embodiment, second light-emitting layer (LEL2) 142 is provided over first light-emitting layer 141. Second light-emitting layer 142 can have a peak emission in the blue to cyan portion of the spectrum, so that white light is produced by the combined emission of the two light-emitting layers when the first light-emitting layer has a peak emission in the yellow to red portion of the spectrum. Second light-emitting layer 142 includes a second host material and a second light-emitting material. In one embodiment, the second host material is one or more mono-anthracene derivatives, wherein the mono-anthracene derivatives are selected from the same potential mono-anthracene derivatives as for first light-emitting layer 141. The mono-anthracene derivative(s) selected for second light-emitting layer 142 can be the same as or different from those selected for first light-emitting layer 141.

In another embodiment, the second host material can include a mixture of one or more mono-anthracene derivatives provided in a volume fraction range of greater than 85% to less than 100% relative to the total host volume, and one or more aromatic amine derivatives provided in a volume fraction range of greater than 0% to less than 15% relative to the total host volume. The mono-anthracene derivatives are selected from the same mono-anthracene derivative candidates, and the aromatic amine derivatives from the same aromatic amine derivative candidates, as for first light-emitting layer 141. The mono-anthracene derivative(s) selected for second light-emitting layer 142 can be the same as or different from those selected for first light-emitting layer 141. Likewise, the aromatic amine derivative(s) selected for second light-emitting layer 142 can be the same as or different from those selected for first light-emitting layer 141.

The second light-emitting material can be a light-emitting blue dopant and can include perylene or derivatives thereof, blue-emitting derivatives of distyrylbenzene or a distyrylbiphenyl that have one or more aryl amine substituents, or a compound of the structure M1:

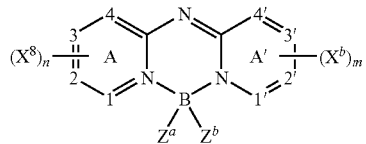

wherein:
A and A' represent independent azine ring systems corresponding to 6-membered aromatic ring systems containing at least one nitrogen;
$(X^a)_n$ and $(X^b)_m$ represent one or more independently selected substituents and include acyclic substituents or are joined to form a ring fused to A or A';
m and n are independently 0 to 4;
$Z^a$ and $Z^b$ are independently selected substituents;
1, 2, 3, 4, 1', 2', 3', and 4' are independently selected as either carbon or nitrogen atoms; and
provided that $X^a$, $X^b$, $Z^a$, and $Z^b$, 1, 2, 3, 4, 1', 2', 3', and 4' are selected to provide blue luminescence.

Some examples of the above class of dopants include the following:

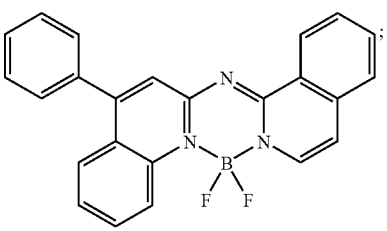

M3 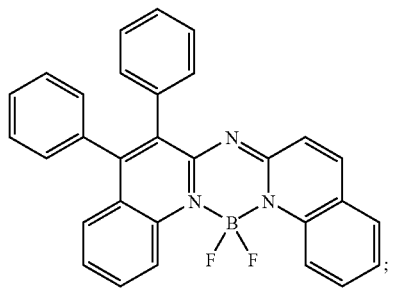

M4 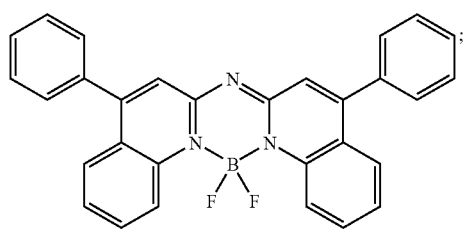

M5 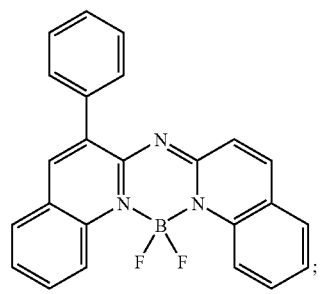

M6 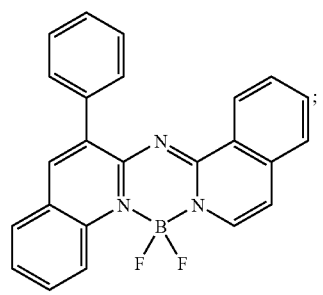

M7 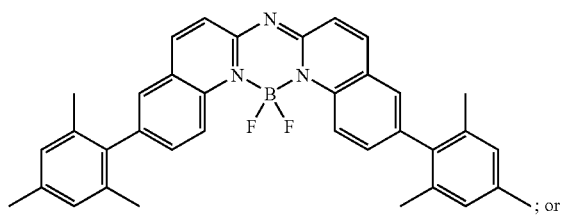;  or

M8 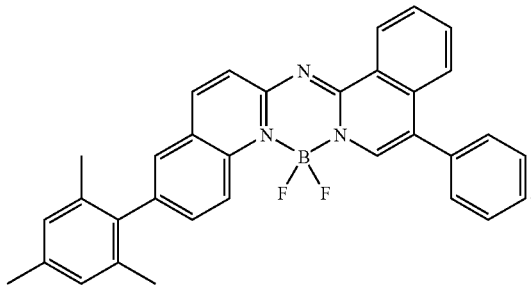.

Another particularly useful class of blue dopants includes blue-emitting derivatives of such distyrylarenes as distyrylbenzene and distyrylbiphenyl, including compounds described in U.S. Pat. No. 5,121,029. Among derivatives of distyrylarenes that provide blue luminescence, particularly useful are those substituted with diarylamino groups, also known as distyrylamines. Examples include bis[2-[4-[N,N-diarylamino]phenyl]vinyl]-benzenes of the general structure N1 shown below:

N1

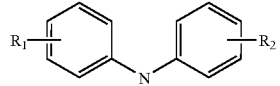

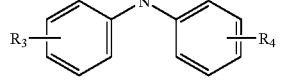

and bis[2-[4-[N,N-diarylamino]phenyl]vinyl]biphenyls of the general structure N2 shown below:

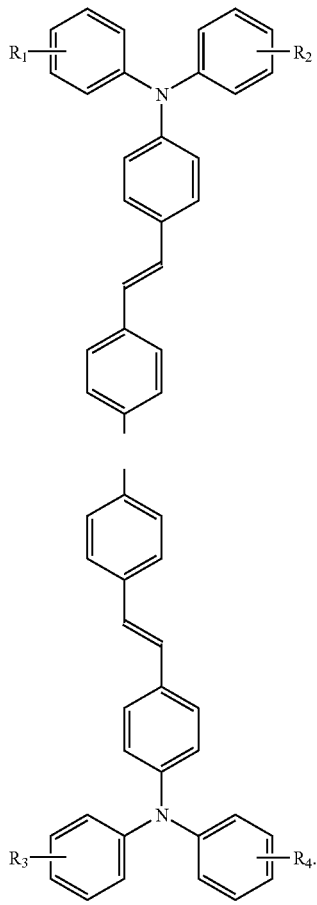

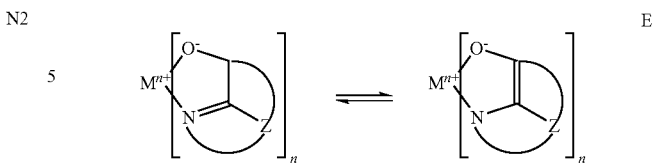

wherein:
M represents a metal;
n is an integer of from 1 to 3; and
Z independently in each occurrence represents the atoms completing a nucleus having at least two fused aromatic rings.

From the foregoing it is apparent that the metal can be a monovalent, divalent, or trivalent metal. The metal can, for example, be an alkali metal, such as lithium, sodium, or potassium; an alkaline earth metal, such as beryllium, magnesium or calcium; or an earth metal, such as boron or aluminum. Generally any monovalent, divalent, or trivalent metal known to be a useful chelating metal can be employed.

Z completes a heterocyclic nucleus containing at least two fused aromatic rings, at least one of which is an azole or azine ring. Additional rings, including both aliphatic and aromatic rings, can be fused with the two required rings, if required. To avoid adding molecular bulk without improving on function the number of ring atoms is usually maintained at 18 or less.

Illustrative of useful chelated oxinoid compounds are the following:

CO-1: Aluminum trisoxine [alias, tris(8-quinolinolato)aluminum(III)];
CO-2: Magnesium bisoxine [alias, bis(8-quinolinolato)magnesium(II)];
CO-3: Bis[benzo {f}-8-quinolinolato]zinc (II);
CO-4: Bis(2-methyl-8-quinolinolato)aluminum(III)-□-oxo-bis(2-methyl -8-quinolinolato) aluminum(III);
CO-5: Indium trisoxine [alias, tris(8-quinolinolato)indium];
CO-6: Aluminum tris(5-methyloxine)[alias, tris(5-methyl-8-quinolinolato) aluminum(III)];
CO-7: Lithium oxine [alias, (8-quinolinolato)lithium(I)];
CO-8: Gallium oxine [alias, tris(8-quinolinolato)gallium (III)]; and
CO-9: Zirconium oxine [alias, tetra(8-quinolinolato)zirconium(IV)].

In Formulas N1 and N2, $R_1$-$R_4$ can be the same or different, and individually represent one or more substituents such as alkyl, aryl, fused aryl, halo, or cyano. In a preferred embodiment, $R_1$-$R_4$ are individually alkyl groups, each containing from one to about ten carbon atoms. A particularly preferred blue dopant of this class is 1,4-bis[2-[4-[N,N-di(p-tolyl)amino]phenyl]vinyl]benzene (BDTAPVB, Formula L47 above).

While not always necessary, it is often useful that OLED device 300 includes an organic layer disposed over light-emitting layers 141 and 142, wherein the organic layer includes an electron-transporting material, e.g. electron-transporting layer 150. Desired electron-transporting materials can be deposited by any suitable way such as evaporation, sputtering, chemical vapor deposition, electrochemical means, thermal transfer, or laser thermal transfer from a donor material. Preferred electron-transporting materials for use in electron-transporting layer 150 are metal chelated oxinoid compounds, including chelates of oxine itself (also commonly referred to as 8-quinolinol or 8-hydroxyquinoline). Such compounds help to inject and transport electrons and both exhibit high levels of performance and are readily fabricated in the form of thin films. Exemplary of contemplated oxinoid compounds are those satisfying structural Formula E Other electron-transporting materials include various butadiene derivatives as disclosed in U.S. Pat. No. 4,356,429 and various heterocyclic optical brighteners as described in U.S. Pat. No. 4,539,507. Benzazoles satisfying structural Formula G are also useful electron-transporting materials.

Other electron-transporting materials can be polymeric substances, e.g. polyphenylenevinylene derivatives, poly-para-phenylene derivatives, polyfluorene derivatives, polythiophenes, polyacetylenes, and other conductive polymeric organic materials such as those listed in *Handbook of Conductive Molecules and Polymers*, Vols. 1-4, H. S. Nalwa, ed., John Wiley and Sons, Chichester (1997).

In some embodiments of this invention, it is useful to add a mono-anthracene derivative to electron-transporting layer 150, wherein the mono-anthracene derivative is present in an amount up to 50% by volume. The mono-anthracene derivative is selected from the same mono-anthracene derivative candidates as for first and second light-emitting layers 141 and 142. The mono-anthracene derivative selected for electron-transporting layer 150 can be the same as or different from those selected for the light-emitting layers.

It will be understood that, as is common in the art, some of the layers can have more than one function. Light-emitting layers 141 and 142 can have hole-transporting properties or electron-transporting properties as desired for performance of the OLED device. Hole-transporting layer 130 or electron-transporting layer 150, or both, can also have emitting properties. In such a case, fewer layers than described above can be sufficient for the desired emissive properties, or additional useful emissive properties can be obtained with the use of additional emissive layers. For example, electron-transporting layer 150 can include a light-emitting material, thereby providing a third light-emitting layer. This third light-emitting layer can have a peak emission in the yellow to green portion of the spectrum. Such a device can provide white light with a red first light-emitting layer 141, a blue second light-emitting layer 142, and a green light-emitting electron-transporting layer 150. Such a light-emitting electron-transporting layer can also include a mono-anthracene derivative as described above for additional stabilizing effects.

An electron-injecting layer 160 can also be present between the cathode and the electron-transporting layer. Examples of electron-injecting materials include alkali or alkaline earth metals, alkali halide salts, such as LiF, or alkali or alkaline earth metal doped organic layers.

Cathode 170 is formed over the electron-injecting layer 160 or over electron-transporting layer 150 if an electron-injecting layer is not used. When light emission is through the anode 110, the cathode material can be comprised of nearly any conductive material. Desirable materials have effective film-forming properties to ensure effective contact with the underlying organic layer, promote electron injection at low voltage, and have effective stability. Useful cathode materials often contain a low work function metal (<4.0 eV) or metal alloy. One preferred cathode material is comprised of a Mg:Ag alloy wherein the percentage of silver is in the range of 1% to 20% by atomic ratio, as described in U.S. Pat. No. 4,885,211. Another suitable class of cathode materials includes bilayers comprising a thin inorganic EIL in contact with an organic layer (e.g., organic EIL, or organic ETL), which is capped with a thicker layer of a conductive metal. Here, the inorganic EIL preferably includes a low work function metal or metal salt and, if so, the thicker capping layer does not need to have a low work function. One such cathode is comprised of a thin layer of LiF followed by a thicker layer of Al as described in U.S. Pat. No. 5,677,572. Other useful cathode materials include, but are not limited to, those disclosed in U.S. Pat. Nos. 5,059,861, 5,059,862, and 6,140,763.

When light emission is viewed through cathode 170, it should be transparent or nearly transparent. For such applications, metals should be thin or one should use transparent conductive oxides, or include these materials. Optically transparent cathodes have been described in more detail in U.S. Pat. Nos. 4,885,211; 5,247,190; 5,703,436; 5,608,287; 5,837,391; 5,677,572; 5,776,622; 5,776,623; 5,714,838; 5,969,474; 6,137,223; 6,140,763; 6,278,236; 6,284,393; 6,548,956 and EP 1 076 368. Cathode materials can be deposited by thermal evaporation, electron beam evaporation, ion sputtering, or chemical vapor deposition. When needed, patterning can be achieved through many well known methods including, but not limited to, through-mask deposition, integral shadow masking as described in U.S. Pat. No. 5,276,380 and EP 0 732 868, laser ablation, and selective chemical vapor deposition.

Cathode 170 is spaced, meaning it is vertically spaced apart from anode 110. Cathode 170 can be part of an active matrix device and in that case is a single electrode for the entire display. Alternatively, cathode 170 can be part of a passive matrix device, in which each cathode 170 can activate a column of pixels, and cathodes 170 are arranged orthogonal to anodes 110.

There are numerous configurations of the organic EL media layers wherein the present invention can be successfully practiced. Examples of organic EL media layers that produce white light are described, for example, in EP 1 187 235, U.S. Patent Application Publication 2002/0025419, EP 1 182 244, and U.S. Pat. Nos. 5,683,823; 5,503,910; 5,405,709; and 5,283,182. As shown in EP 1 187 235, a white light-emitting organic EL element with a substantially continuous spectrum in the visible region of the spectrum can be achieved by providing at least two different dopants for collectively emitting white light, e.g. by the inclusion of the following layers:

a hole-injecting layer disposed over the anode;
 a hole-transporting layer that is disposed over the hole-injecting layer and is doped with a light-emitting yellow dopant for emitting light in the yellow region of the spectrum;
 a blue light-emitting layer including a host material and a light-emitting blue dopant disposed over the hole-transporting layer; and
 an electron-transporting layer.

The OLED of the present invention is typically provided over a supporting substrate where either the cathode or anode can be in contact with the substrate. The electrode in contact with the substrate is conveniently referred to as the bottom electrode. Conventionally, the bottom electrode is the anode, but the present invention is not limited to that configuration. The substrate can either be light transmissive or opaque, depending on the intended direction of light emission. The light transmissive property is desirable for viewing the EL emission through the substrate. Transparent glass or plastic is commonly employed in such cases. For applications where the EL emission is viewed through the top electrode, the transmissive characteristic of the bottom support is immaterial, and therefore can be light transmissive, light-absorbing, or light reflective. Substrates for use in this case include, but are not limited to, glass, plastic, semiconductor materials, silicon, ceramics, and circuit board materials. Of course, it is necessary to provide in these device configurations a light-transparent top electrode.

The organic materials mentioned above are suitably deposited through a vapor-phase method such as sublimation, but can be deposited from a fluid, for example, from a solvent with an optional binder to improve film formation. If the material is a polymer, solvent deposition is useful but other methods can be used, such as sputtering or thermal transfer from a donor sheet. The material to be deposited by sublimation can be vaporized from a sublimation "boat" often comprised of a tantalum material, e.g., as described in U.S. Pat. No. 6,237,529, or can be first coated onto a donor sheet and then sublimed in closer proximity to the substrate. Layers with a mixture of materials can use separate sublimation boats or the materials can be premixed and coated from a single boat or donor sheet. Patterned deposition can be achieved using shadow masks, integral shadow masks (U.S. Pat. No. 5,294,870), spatially-defined thermal dye transfer from a donor sheet (U.S. Pat. Nos. 5,688,551; 5,851,709 and 6,066,357), and inkjet method (U.S. Pat. No. 6,066,357).

Most OLED devices are sensitive to moisture or oxygen, or both, so they are commonly sealed in an inert atmosphere such as nitrogen or argon. In sealing an OLED device in an inert environment, a protective cover can be attached using an organic adhesive, a metal solder, or a low melting temperature glass. Commonly, a getter or desiccant is also provided within the sealed space. Useful getters and desiccants include, alkali and alkaline metals, alumina, bauxite, calcium sulfate, clays, silica gel, zeolites, alkaline metal oxides, alkaline earth metal oxides, sulfates, or metal halides and perchlorates. Methods for encapsulation and desiccation include, but are not limited to, those described in U.S. Pat. No. 6,226,890. In addition, barrier layers such as SiOx, Teflon, and alternating inorganic/polymeric layers are known in the art for encapsulation.

OLED devices of the present invention can employ various well-known optical effects in order to enhance its properties if desired. This includes optimizing layer thicknesses to yield maximum light transmission, providing dielectric mirror structures, replacing reflective electrodes with light-absorbing electrodes, providing anti glare or anti-reflection coatings over the display, providing a polarizing medium over the display, or providing colored, neutral density, or color conversion filters in functional relationship with the light-emitting areas of the display. Filters, polarizers, and anti-glare or anti-reflection coatings can also be provided over a cover or as part of a cover.

White or broadband emission can be combined with color filters to provide full color or multicolor display. The color filters can include red, green, and blue filters. The present invention is suitably used in displays having four differently colored pixels, for example, red, green, blue, and white emitting pixels (RGBW) as described in U.S. Patent Application Publication 2004/0113875 A1. The white emitting pixel is substantially not filtered, although it can have some small amount of filtering to trim the color or incidental filtering that might occur due to encapsulation layers or the like provided over the white pixel. Five or more color systems can also be useful.

The OLED device can have a microcavity structure. In one useful example, one of the metallic electrodes is essentially opaque and reflective; the other one is reflective and semi-transparent. The reflective electrode is preferably selected from Au, Ag, Mg, Ca, or alloys thereof. Because of the presence of the two reflecting metal electrodes, the device has a microcavity structure. The strong optical interference in this structure results in a resonance condition. Emission near the resonance wavelength is enhanced and emission away from the resonance wavelength is depressed. The optical path length can be tuned by selecting the thickness of the organic layers or by placing a transparent optical spacer between the electrodes. For example, an OLED device of this invention can have ITO spacer layer placed between a reflective anode and the organic EL media, with a semitransparent cathode over the organic EL media.

The present invention can be used in tandem structures having multiple organic EL units, e.g., as described in U.S. Pat. Nos. 6,717,358 and 6,872,472.

The present invention can be employed in most OLED device applications. These include very simple structures comprising a single anode and cathode to more complex devices, such as area color displays, passive matrix displays comprised of orthogonal arrays of anodes and cathodes to form pixels, and active matrix displays where each pixel is controlled independently, for example, with thin film transistors (TFTs). The invention can also be employed for devices where the OLED is used as a light source, for example, in solid-state lighting or backlights for LCD displays.

EXAMPLES

The following examples are presented for a further understanding and appreciation of the present invention. The EL characteristics of all the fabricated devices were evaluated using a constant current source (KEITHLEY 2400 SourceMeter) and a photometer (PHOTO RESEARCH SpectraScan PR 650) at room temperature. The colors are reported using Commission Internationale de l'Eclairage (CIE) coordinates. In the following, mixed compositions are described in terms of percentages or ratios by volume, as are commonly used in the art. Although described in detail below, for convenience, the device structures are summarized in Table 1.

All OLED devices had an emission area of 10 $mm^2$, and were initially tested by applying a current of 20 $mA/cm^2$ across the electrodes to determine luminance efficiency (cd/A), driving voltage (V), and color coordinates. The devices were further tested for operational stability at room temperature (25° C. ambient conditions under 80 $mA/cm2$ driving conditions), and elevated temperature (85° C. under 20 $mA/cm2$ driving conditions). For both room and elevated temperature testing, the luminance stability is reported in terms of time to half of its initial brightness, and the voltage rise during stability testing is also reported. These data can be found in Table 2.

Comparative Example 1

This comparative OLED device used the same hole-transporting material (NPB) in the hole-transporting layer and in the adjacent first light-emitting layer.

A clean glass substrate was vacuum-deposited with indium tin oxide (ITO) to form a transparent electrode 85 nm thick. The above-prepared ITO surface was treated with a plasma oxygen etch, followed by plasma deposition of a 0.5 nm layer of a fluorocarbon polymer (CFx) as described in U.S. Pat. No. 6,208,075. The following layers were then deposited over the CFx layer in the following sequence by evaporation from heated boats under a vacuum of approximately $10^{-6}$ Torr:
  a) A 260 nm hole-transporting layer of 4,4'-bis[N-(1-naphthyl)-N-phenylamino]biphenyl (NPB);
  b) A 20 nm first light-emitting layer including 96.5% NPB (as host) and 3.5% yellow-orange light-emitting dopant as shown in Formula P4;
  c) A 45 nm second light-emitting layer including 92% 9-(1-naphthyl)-10-(biphenyl-4-yl) anthracene (Blue Host-Formula AH3), 7% NPB, and 1% Formula M7 as blue light-emitting dopant;
  d) A 10 nm layer of tris(8-quinolinolato) aluminum (III) (ALQ) as an electron-transporting layer (ETL);
  e) A 0.5 nm layer of LiF as an electron injection layer (EIL); and
  f) A 100 nm layer of aluminum, to form a cathode layer.

After deposition of these layers the device was then transferred to a dry box for encapsulation.

The data in Table-2 show that this device had relatively good luminance stability under room temperature testing. However, at high temperature, the luminance stability was quite poor. The poor high temperature stability at 85° C. was expected since the softening temperature (Tg) for the NPB hole transporting layer is around 95° C., due to the heat generated by the OLED device in combination with the high test temperature (85° C.). Under both high and low temperature testing, there was a large voltage rise.

Comparative Example 2

This comparative OLED device used a hole-transporting material (NPB) in the hole-transporting layer that has a lower Tg than the hole-transporting material used as the main component in the first light-emitting layer (TNB).

Comparative Example 2 was fabricated by following the procedure used for Comparative Example 1, except that the yellow light-emitting layer used TNB instead of NPB.

The data in Table 2 show that this device had relatively good luminance stability under room temperature testing. However, at high temperature, the luminance stability was quite poor. The poor high temperature stability at 85° C. was not unexpected. Even though the yellow light-emitting layer used, as a main component, the hole transporting material TNB having a Tg of 134 C (significantly higher than the Tg of NPB), the hole transporting layer still used NPB. Thus, the NPB HTL was expected to be the weak link in temperature stability. Further, under both high and low temperature testing, there was a large voltage rise.

Comparative Example 3

This comparative OLED device used the same hole-transporting material (TNB) in both the hole-transporting layer and the adjacent first light-emitting layer. TNB is known to have higher temperature stability than NPB.

Comparative Example 3 was fabricated by following the procedure used for Comparative Example 2, except that the hole transporting material used in the HTL was TNB instead of NPB.

The data in Table 2 show that this device had improved luminance stability under high temperature testing relative to Comparative Examples 1 and 2. This was not unexpected because both the HTL and yellow light emitting layer used a hole transporting material having a high Tg (TNB). At room temperature, unfortunately, this device had significantly worse luminance stability than Comparative Examples 1 and 2. That is, although high temperature stability was improved, it came at the cost of room temperature stability. As before, under both high and low temperature testing, there was a large voltage rise observed.

Inventive Example 1

An OLED device of the present invention was fabricated. This inventive OLED device used a hole-transporting material (TNB) in the hole-transporting layer that has a higher Tg than the hole-transporting material used as the main component in the first light-emitting layer (NPB).

Inventive Example 1 was fabricated by following the procedure used for Comparative Example 1, except that the hole transporting material used in the HTL was TNB instead of NPB. The yellow light-emitting layer still used NPB like Comparative Example 1.

The data in Table 2 show that this inventive device has relatively good luminance stability under room temperature testing. It was significantly better than that of Comparative Example 3 and almost as good as those of Comparative Examples 1 and 2. At high temperature, the luminance stability was unexpectedly good (451 hours) which is 50% higher than that of Comparative Example 3 and much higher than Comparative Example 2. This result was a surprise because, although the HTL used a high temperature stability material (TNB), the yellow light-emitting layer used as a main component a hole transporting material with a lower Tg (NPB). It was expected that the high temperature stability would be similar to that of Comparative Example 2 which also used one layer having high Tg hole transporting material and another layer having lower Tg material. Further, one would certainly have expected the high temperature stability of Comparative Example 3 to be better than that of Example 1, but that was not the case.

Inventive Example 2

Inventive Example 2 was fabricated by following a procedure similar to that used for Inventive Example 1 with the following exceptions. After treating the substrate with O2 plasma, 3 mu of CFx was deposited as an HIL instead of 0.5 nm. The hole-transporting layer consisted of 130 nm of TNB instead of 260 nm. The yellow light-emitting layer was 30 nm thick, including 67.5% NPB as the main component, 30% anthracene derivative of formula AH3 and 2.5% yellow-or-ange emitting dopant as shown in Formula L50. The blue light-emitting layer used 1% TBP as the blue light-emitting dopant instead of M7. Other layers and materials were the same as Inventive Example 1.

The data in Table 2 show that this inventive device has much improved luminance stability at room temperature testing relative to the comparisons, and excellent luminance stability under high temperature testing. Further, Inventive Example 2 had very low voltage rise under both room temperature and high temperature testing conditions relative to the comparisons and also Inventive Example 1.

Inventive Example 3

Inventive Example 3 was fabricated by following the procedure used for Inventive Example 2 except that the HTL was only 10 nm thick, the blue light-emitting layer was 40 nm, and the ETL was only 5 nm thick The data in Table 2 show that this inventive device has performance comparable to that of Inventive Example 2, except it had a lower initial driving voltage due to the thinning of some layers (HTL, blue LEL, and ETL). It appears that the voltage rise was also a bit lower for Inventive Example 3 vs. Inventive Example 2 (and much lower than the comparisons).

Inventive Example 4

Inventive Example 4 was fabricated by following the procedure used for Inventive Example 2 except that 15 nm CuPC was deposited instead of CFx, and the HTL was 35 nm instead of 130 nm.

The data in Table 2 show that this inventive device has performance comparable to that of Inventive Example 2, except that the room temperature stability was now even better. However, with CuPC as the HIL, the initial drive voltage was higher and the color was shifted more yellowish.

Inventive Example 5

Inventive Example 5 was fabricated by following the procedure used for Inventive Example 2, but with a number of changes. No O2 plasma pretreatment was used. Instead of CFx, the hole-injection layer of 10 nm hexaazatriphenylene derivative Formula Q1 was deposited. The hole-transporting layer was 10 nm thick. The yellow light-emitting layer was 20 nm thick. The blue light-emitting layer was 23 nm thick. The ETL was 20 nm thick and included 49% Alq and 49% Bphen with 2% Li metal.

The data in Table 2 show that this inventive device has performance roughly comparable to Inventive Example 3, but has the additional advantage of having even lower initial drive voltage.

It can be readily seen that this invention provides a way to make an OLED device that has improved high temperature stability while maintaining good room temperature stability. The invention has been described in detail with particular reference to certain preferred embodiments thereof, but it will be understood that variations and modifications can be effected within the spirit and scope of the invention.

TABLE 1

Device Structures for examples (% by volume)

| Device # | O2 Treatment (seconds) | HIL | HTL | Yellow (first) light-emitting layer | Blue (second) light emitting layer | ETL | EIL (LiF) | Cathode (Al) |
|---|---|---|---|---|---|---|---|---|
| Comparative Example 1 | 120 | 0.5 nm CFx | 260 nm NPB | 20 nm 96.5% NPB + 3.5% P4 | 45 nm 92% AH3 + 7% NPB + 1% M7 | 10 nm Alq | 0.5 nm | 100 nm |
| Comparative Example 2 | 120 | 0.5 nm CFx | 260 nm NPB | 20 nm 96.5% TNB + 3.5% P4 | 45 nm 92% AH3 + 7% NPB + 1% M7 | 10 nm Alq | 0.5 nm | 100 nm |
| Comparative Example 3 | 120 | 0.5 nm CFx | 260 nm TNB | 20 nm 96.5% TNB + 3.5% P4 | 45 nm 92% AH3 + 7% NPB + 1% M7 | 10 nm Alq | 0.5 nm | 100 nm |
| Inventive Example 1 | 120 | 0.5 nm CFx | 260 nm TNB | 20 nm 96.5% NPB + 3.5% P4 | 45 nm 92% AH3 + 7% NPB + 1% M7 | 10 nm Alq | 0.5 nm | 100 nm |
| Inventive Example 2 | 120 | 3 nm CFx | 130 nm TNB | 30 nm 67.5% NPB + 30% AH3 + 2.5% L50 | 45 nm 92% AH3 + 7% NPB + 1% TBP | 10 nm Alq | 0.5 nm | 100 nm |
| Inventive Example 3 | 120 | 3 nm CFx | 10 nm TNB | 30 nm 67.5% NPB + 30% AH3 + 2.5% L50 | 40 nm 92% AH3 + 7% NPB + 1% TBP | 5 nm Alq | 0.5 nm | 100 nm |
| Inventive Example 4 | 120 | 15 nm CuPC | 35 nm TNB | 30 nm 67.5% NPB + 30% AH3 + 2.5% L50 | 45 nm 92% AH3 + 7% NPB + 1% TBP | 10 nm Alq | 0.5 nm | 100 nm |
| Inventive Example 5 | 0 | 15 nm Q1 | 10 nm TNB | 20 nm 67.5% NPB + 30% AH3 + 2.5% L50 | 23 nm 92% AH3 + 7% NPB + 1% TBP | 10 nm, 49% Alq 49% Bphen 2% Li | 0.5 nm | 100 nm |

TABLE 2

Device performance data for examples

| Device # | Initial performance @ 20 mA/cm² | | | | Room Temperature Stability (25° C. @ 80 mA/cm²) | | High Temperature Stability (85° C. @ 20 mA/cm²) | |
|---|---|---|---|---|---|---|---|---|
|  | cd/A | CIEx | CIEy | initial voltage (V) | voltage rise (V) | half life (hours) | voltage rise (V) | half life (hours) |
| Comparative Example 1 | 10.7 | 0.34 | 0.29 | 9.4 | 16.7 | 281 | 22.0 | 89 |
| Comparative Example 2 | 10.1 | 0.34 | 0.29 | 9.6 | 5.1 | 294 | 22.0 | 140 |
| Comparative Example 3 | 10.0 | 0.33 | 0.28 | 9.3 | 10.8 | 153 | 8.8 | 297 |
| Inventive Example 1 | 10.8 | 0.33 | 0.28 | 9.7 | 13.1 | 250 | 10.9 | 451 |
| Inventive Example 2 | 11.7 | 0.35 | 0.33 | 9.5 | 2.1 | 755 | 3.9 | 1400 |
| Inventive Example 3 | 11.8 | 0.35 | 0.35 | 6.6 | 1.2 | 1010 | 0.5 | 1111 |
| Inventive Example 4 | 15.0 | 0.40 | 0.42 | 10.5 | 0.3 | 1800 | 1.1 | 1300 |
| Inventive Example 5 | 12.1 | 0.36 | 0.38 | 4.9 | 0.6 | 1200 | 0.2 | 1107 |

PARTS LIST

100 OLED Structure
101 Substrate
110 Anode
120 HIL
130 HTL
131 HTL1
132 HTL2
140 LEL
141 LEL1
142 LEL2
150 ETL
160 EIL
170 Cathode
200 OLED structure
300 OLED structure

The invention claimed is:

1. A broadband-emitting OLED device comprising:
   a) an anode and a spaced cathode
   b) a hole-transporting layer provided between the anode and cathode, such hole-transporting layer including as a main component a first hole-transporting material which is selected from arylamine derivatives having a first glass transition temperature Tg1;

c) a first light-emitting layer including as a main component 4,4'-bis[N-(1-naphthyl)-N-phenylamino]biphenyl (NPB) having a second glass transition temperature Tg2, such light-emitting layer disposed between the hole transporting layer and the cathode and in contact with the hole-transporting layer, and wherein Tg1 is greater than Tg2; and d) a second light-emitting layer disposed between the first light-emitting layer and the cathode; and wherein the first light-emitting layer emits light having a hue in a range of yellow to red, and the second light-emitting layer emits light having a hue in a range from blue to green.

2. The broadband-emitting OLED of claim 1 wherein the first light-emitting layer further includes an anthracene derivative and a light-emitting dopant, such anthracene derivative provided in an amount that is less than NPB by volume.

3. The broadband-emitting OLED of claim 2 wherein the second light-emitting layer includes NPB in an amount of greater than 0% and less than 15% by volume.

4. The broadband-emitting OLED device of claim 1 further including a hole-injecting layer in contact with the hole-transporting layer and the anode.

5. The broadband-emitting OLED device of claim 1 wherein the first hole transporting material includes TNB, iso-TNB derivatives, spiro-TAD, or spiro-NPB.

6. The broadband-emitting OLED device of claim 1 wherein the first hole transporting material includes TNB.

7. The broadband-emitting OLED device of claim 4 wherein the hole injecting layer includes a fluorocarbon compound, hexaazatriphenylene derivatives, porphyrinic compounds, m-MTDATA (4,4',4"-tris[(3-methylphenyl) phenylamino]triphenylamine), or inorganic oxides including vanadium oxide (VOx), molybdenum oxide (MoOx), nickel oxide (NiOx) or tungsten oxide (WOx).

8. The broadband-emitting OLED device of claim 1 wherein the thickness of the hole-transporting layer is in a range of 5 nm-260 nm.

9. The broadband-emitting OLED device of claim 1 wherein the thickness of the hole-transporting layer is in a range of 5 nm-40 nm.

* * * * *